(12) United States Patent
Antonyan

(10) Patent No.: US 10,896,699 B1
(45) Date of Patent: Jan. 19, 2021

(54) MEMORY DEVICES INCLUDING SWITCH CIRCUIT THAT OPERATES REGARDLESS OF POWER SUPPLY VOLTAGE

(71) Applicant: Samsung Electronics Co., Ltd., Suwon-si (KR)

(72) Inventor: Artur Antonyan, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/803,239

(22) Filed: Feb. 27, 2020

(30) Foreign Application Priority Data

Jul. 11, 2019 (KR) .................... 10-2019-0083735

(51) Int. Cl.
*G11C 5/14* (2006.01)
*G11C 11/16* (2006.01)
*G11C 7/12* (2006.01)
*G11C 7/22* (2006.01)

(52) U.S. Cl.
CPC .......... *G11C 5/147* (2013.01); *G11C 11/1655* (2013.01); *G11C 11/1673* (2013.01); *G11C 11/1675* (2013.01); *G11C 11/1697* (2013.01); *G11C 7/12* (2013.01); *G11C 7/22* (2013.01)

(58) Field of Classification Search
None
See application file for complete search history.

(56) References Cited

U.S. PATENT DOCUMENTS

| 6,894,922 | B1 * | 5/2005 | Hidaka | G11C 11/16 365/158 |
|---|---|---|---|---|
| 6,995,999 | B2 | 2/2006 | Morimoto | |
| 8,027,206 | B2 | 9/2011 | Yoon et al. | |
| 9,047,965 | B2 | 6/2015 | Alam et al. | |
| 9,286,974 | B2 | 3/2016 | Chang et al. | |
| 9,437,270 | B2 | 9/2016 | Yi et al. | |
| 10,090,035 | B2 | 10/2018 | Kim | |
| 2011/0216587 | A1 * | 9/2011 | Lee | G11C 16/04 365/185.03 |
| 2014/0092690 | A1 * | 4/2014 | Tsai | G11C 16/08 365/189.02 |
| 2014/0092692 | A1 * | 4/2014 | Tsai | G11C 7/1087 365/189.05 |
| 2018/0374525 | A1 | 12/2018 | Antonyan | |

FOREIGN PATENT DOCUMENTS

| CN | 109119107 | 1/2019 |
|---|---|---|
| JP | 2012185870 | 9/2012 |

* cited by examiner

*Primary Examiner* — Tan T. Nguyen
(74) *Attorney, Agent, or Firm* — Myers Bigel, P.A.

(57) ABSTRACT

A memory device includes a memory cell connected to a bit line and a source line, a read and write circuit configured to read data of the memory cell and/or write data in the memory cell, and a switch circuit configured to receive a selection signal based on a power supply voltage. The switch circuit includes a first switch connected between the bit line and the read and write circuit, a second switch connected between the source line and the read and write circuit, and a switch controller configured to turn on or turn off the first and the second switches based on the selection signal using one of a read voltage and a write voltage that are different from the power supply voltage.

20 Claims, 17 Drawing Sheets

MEMORY DEVICES INCLUDING SWITCH CIRCUIT THAT OPERATES REGARDLESS OF POWER SUPPLY VOLTAGE

CROSS-REFERENCE TO RELATED APPLICATION

This application claims priority under 35 U.S.C. § 119 to Korean Patent Application No. 10-2019-0083735 filed on Jul. 11, 2019, in the Korean Intellectual Property Office, the entire disclosure of which is incorporated by reference herein.

BACKGROUND

Embodiments of the inventive concepts disclosed herein relate to memory devices, and more particularly, relate to memory devices including a switch circuit that operates regardless of a power supply voltage.

As a memory device is manufactured through a nano-scale manufacturing technology, a level of a power supply voltage that is applied to transistors of the memory device may gradually decrease. As the level of the power supply voltage decreases, it may become difficult to write data in a memory cell of the memory device or read data from the memory cell by directly using the power supply voltage.

Determining data stored in the memory device may include identifying a voltage or a current corresponding to data of a memory cell. However, as the level of the power supply voltage decreases, a range of a voltage or a current corresponding to data may also become narrower, which may cause a decrease of a margin where data are validly determined.

SUMMARY

Embodiments of the inventive concepts provide a memory device including a switch circuit that operates regardless of a power supply voltage.

According to an example embodiment of the inventive concepts, a memory device includes a memory cell connected to a bit line and a source line, a read and write circuit configured to read data of the memory cell and/or write data in the memory cell, and a switch circuit configured to receive a selection signal based on a power supply voltage. The switch circuit includes a first switch connected between the bit line and the read and write circuit, a second switch connected between the source line and the read and write circuit, and a switch controller configured to turn on or turn off the first and the second switches based on the selection signal using one of a read voltage and a write voltage that are different from the power supply voltage.

According to an example embodiment of the inventive concepts, a memory device includes a memory cell connected to a bit line and a source line, and a switch circuit. The switch circuit includes a first terminal connected to the bit line, a second terminal connected to the source line, a third terminal receiving one of a ground voltage and a write voltage, a fourth terminal receiving one of the ground voltage, the write voltage, and a sensing voltage, a fifth terminal receiving one of the ground voltage, the write voltage, and a read voltage, and a sixth terminal receiving a selection signal based on a power supply voltage. The switch circuit is configured to electrically connect the third terminal to the first terminal and electrically connect the fourth terminal to the second terminal based on the selection signal using one of the read voltage and the write voltage that are different from the power supply voltage.

According to an example embodiment of the inventive concepts, a memory device includes a memory cell array comprising a first memory cell and a second memory cell, a read voltage generator configured to generate a read voltage, a write voltage generator configured to generate a write voltage, a sense amplifier configured to generate a sensing voltage, a first switch circuit configured to electrically connect the sense amplifier to the first memory cell using the read voltage or electrically connect the write voltage generator to the first memory cell using the write voltage responsive to a first selection signal that is based on a power supply voltage, and a second switch circuit configured to electrically connect the sense amplifier to the second memory cell using the read voltage or electrically connect the write voltage generator to the second memory cell using the write voltage responsive to a second selection signal that is based on the power supply voltage

BRIEF DESCRIPTION OF THE FIGURES

The above and other objects and features of the inventive concepts will become apparent by describing in detail example embodiments thereof with reference to the accompanying drawings.

DETAILED DESCRIPTION

Figure 1:
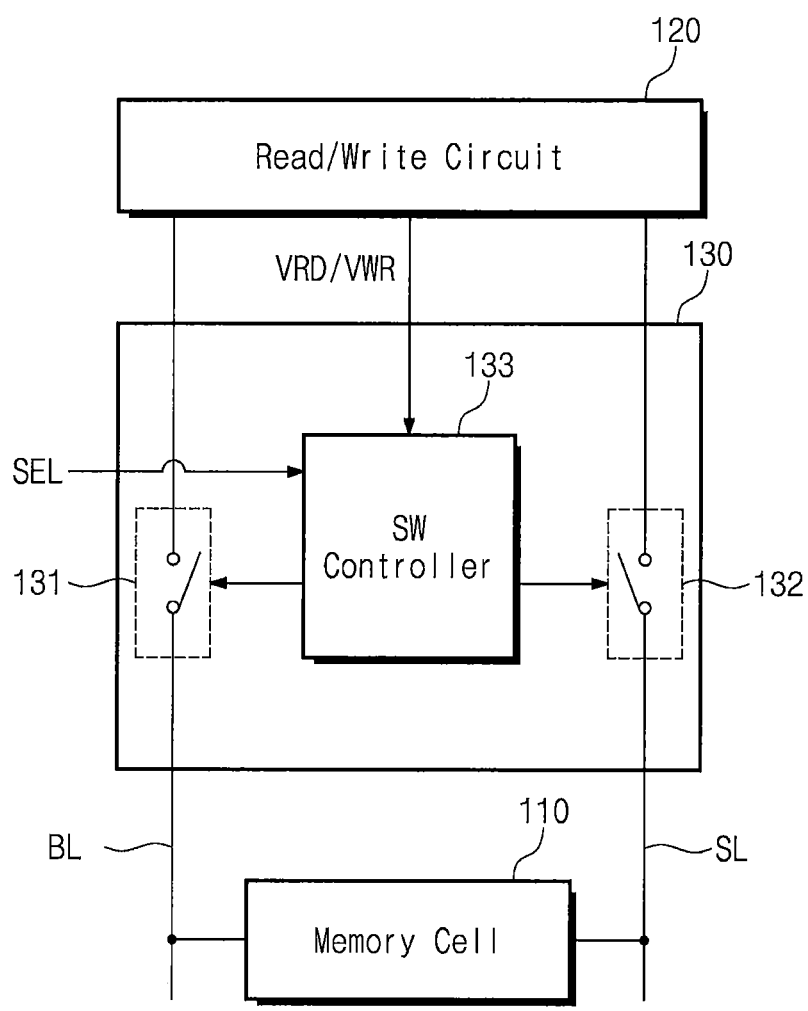
FIG. 1 illustrates a block diagram of a memory device according to an embodiment of the inventive concepts.

FIG. 1 illustrates a block diagram of a memory device 100 according to an embodiment of the inventive concepts. A memory device 100 may include a memory cell 110, a read and write (read/write) circuit 120, and a switch circuit 130.

The memory cell 110 may be respectively connected to a bit line BL and a source line SL. In a write mode of the memory device 100, the memory cell 110 may store data depending on (based on) a voltage of the bit line BL and a voltage of the source line SL. The memory cell 110 may store a first logical value (e.g., "0") or a second logical value (e.g., "1"), depending on (based on) levels of the voltages of the bit line BL and the source line SL. The number of data bits that the memory cell 110 is able to store may be one or more. In a read mode of the memory device 100, data stored in the memory cell 110 may be read depending on (based on) a voltage of the bit line BL and a voltage of the source line SL. For example, the memory cell 110 may be one of a magneto-resistive random access memory (MRAM) cell, a static RAM (SRAM) cell, a dynamic RAM (DRAM) cell, a thyristor RAM (TRAM), a NAND flash memory cell, a NOR flash memory cell, a resistive RAM (RRAM), a ferroelectric RAM (FRAM) cell, and a phase-change RAM (PRAM) cell. In the description that follows, it is assumed that the memory cell 110 is a nonvolatile MRAM cell, but the inventive concepts are not limited thereto.

The read and write circuit 120 may access the memory cell 110 through the switch circuit 130. The read and write circuit 120 may generate a read voltage VRD for reading data of the memory cell 110. The read and write circuit 120 may generate a write voltage VWR for storing, programming, and/or writing data in the memory cell 110. As used herein, the term "and/or" includes any and all combinations of one or more of the associated listed items. The read and write circuit 120 may supply or provide the read voltage VRD and/or the write voltage VWR to the switch circuit 130.

The read and write circuit 120 may read or write data from or in the memory cell 110 by applying voltages to the bit line BL and the source line SL through the switch circuit 130. The voltages applied to the bit line BL and the source line SL may also be applied to the memory cell 110. Voltages of the bit line BL and/or the source line SL in the read mode may be different from voltages of the bit line BL and/or the source line SL in the write mode. Voltages of the bit line BL and/or the source line SL in the write mode for writing the first logical value may be different from voltages of the bit line BL and/or the source line SL in the write mode for writing the second logical value.

The switch circuit 130 may connect the memory cell 110 to the read and write circuit 120 in response to a selection signal SEL. The switch circuit 130 may provide a path between the memory cell 110 and the read and write circuit 120. The switch circuit 130 may include a switch 131, a switch 132, and a switch controller 133.

The switch 131 may be connected between the bit line BL and the read and write circuit 120. The switch 131 may be turned on under control of the switch controller 133 and may electrically connect the bit line BL to the read and write circuit 120. The switch 131 may be turned off under control of the switch controller 133 and may electrically disconnect the bit line BL from the read and write circuit 120.

The switch 132 may be connected between the source line SL and the read and write circuit 120. The switch 132 may be turned on under control of the switch controller 133 and may electrically connect the source line SL to the read and write circuit 120. The switch 132 may be turned off under control of the switch controller 133 and may electrically disconnect the source line SL from the read and write circuit 120.

The switch controller 133 may turn on the switches 131 and 132 when the selection signal SEL is activated (or enabled) and may turn off the switches 131 and 132 when the selection signal SEL is deactivated (or disabled). The selection signal SEL may be a signal that is based on a power supply voltage and/or a ground voltage. For example, when the selection signal SEL is activated, the selection signal SEL may have a level of the power supply voltage or a level of the ground voltage. When the selection signal SEL is deactivated, the selection signal SEL may have a level of the ground voltage or a level of the power supply voltage.

The switch controller 133 may be supplied or provided with the read voltage VRD or the write voltage VWR which are different from the power supply voltage from the read and write circuit 120. The switch controller 133 may turn on or turn off the switches 131 and 132 by using one of the read voltage VRD and the write voltage VWR different from the power supply voltage. The switch controller 133 may turn on the switches 131 and 132 by using the read voltage VRD in the read mode. The switch controller 133 may turn on the switches 131 and 132 by using the write voltage VWR in the write mode.

As the memory device 100 is manufactured through a nano-scale manufacturing technology, a level of the power supply voltage of the memory device 100 may gradually decrease. In the case where the switch controller 133 turns on or turns off the switches 131 and 132 by using power supply voltage that is low, the switches 131 and 132 may not be fully turned on or turned off. When the switches 131 and 132 are not fully turned off, a leakage current may be generated at the switches 131 and 132. When the switches 131 and 132 are not fully turned on, a voltage and/or a current may not be fully transferred from the read and write circuit 120 to the memory cell 110 through the switches 131 and 132, the bit line BL, and the source line SL. In reverse, a voltage and/or a current may not be fully transferred from the memory cell 110 to the read and write circuit 120 through the bit line BL, the source line SL, and the switches 131 and 132. When the switches 131 and 132 are not fully turned on, a write fail and/or a read fail may be caused with regard to the memory cell 110.

The switch controller 133 according to an embodiment of the inventive concepts may fully turn on or turn off the switches 131 and 132 by using one of the read voltage VRD and the write voltage VWR regardless of the power supply voltage. Even though the power supply voltage may become low, the switch controller 133 may fully turn on or turn off the switches 131 and 132 and may operate even under a low power supply voltage condition. Accordingly, the switch controller 133 may reduce and/or prevent occurrence of a leakage current, a write fail, and/or a read fail that may otherwise be caused when turning on or turning off the switches 131 and 132 by using the power supply voltage.

Figure 2:
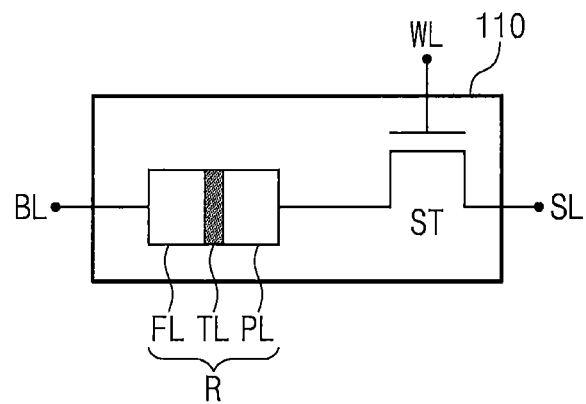
FIG. 2 illustrates a block diagram of the memory cell of FIG. 1.
Figure 3:
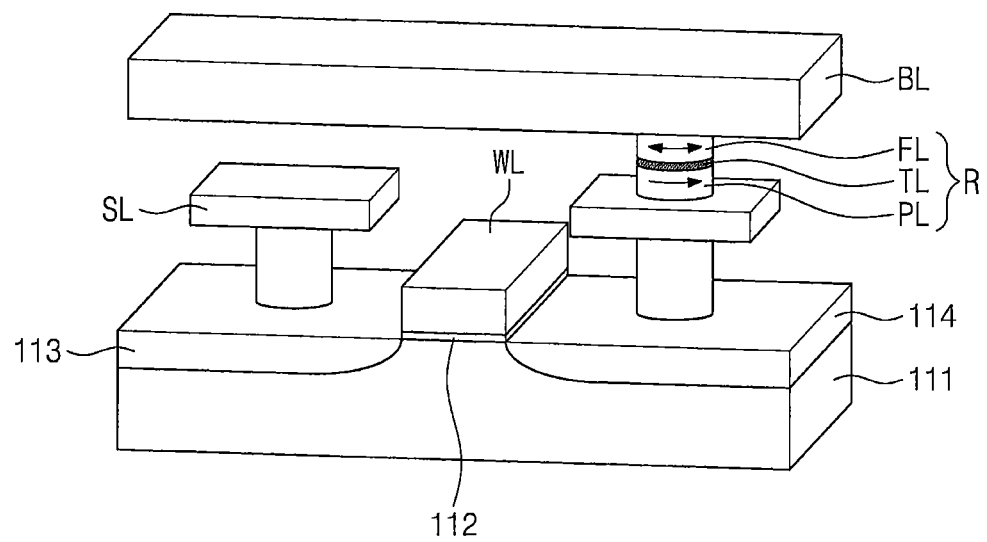
FIG. 3 illustrates an implementation example of the memory cell of FIG. 1.

FIG. 2 illustrates a block diagram of the memory cell 110 of FIG. 1. FIG. 3 illustrates an implementation example of the memory cell 110 of FIG. 1. FIGS. 2 and 3 will be described together. The memory cell 110 may include a selection transistor ST and a variable resistance element "R."

The selection transistor ST may include a body 111 of a substrate, a junction 113 formed in the body 111 and connected (e.g., electrically) to the source line SL, a junction 114 formed in the body 111 and connected (e.g., electrically) to the bit line BL through the variable resistance element "R," and a gate 112 formed on/above the body 111 between the junctions 113 and 114 and forming a word line WL. The variable resistance element "R" may be, in some embodiments, a magnetic tunnel junction (MTJ) element. The variable resistance element "R" may include a pinned layer PL, a tunneling layer TL, and a free layer FL. The pinned layer PL may have a fixed magnetization direction. A magnetization direction of the free layer FL may vary depending on a voltage or a current applied to the variable resistance element "R." A resistance of the variable resistance element "R" may change depending on whether the magnetization direction of the free layer FL is the same as the magnetization direction of the pinned layer PL (or how much the magnetization direction of the free layer FL is matched with the magnetization direction of the pinned layer PL) or the magnetization direction of the free layer FL is different from the magnetization direction of the pinned layer PL (or how much the magnetization direction of the free layer FL is mismatched with the magnetization direction of the pinned layer PL). The resistance of the variable resistance element "R" may indicate data stored in the memory cell 110.

For example, when the ground voltage is applied to the bit line BL and the write voltage VWR is applied to the source line SL, a current may flow from the source line SL to the bit line BL. In this case, the magnetization direction of the free layer FL may be opposite to the magnetization direction of the pinned layer PL. The variable resistance element "R" may be in a high-resistance state and the resistance of the variable resistance element "R" may be relatively large. The variable resistance element "R" may be in an anti-parallel (AP) state, and the memory cell 110 may store the second logical value (e.g., "1"). For example, when the write voltage VWR is applied to the bit line BL and the ground voltage is applied to the source line SL, a current may flow from the bit line BL to the source line SL. In this case, the magnetization direction of the free layer FL may be the same as the magnetization direction of the pinned layer PL. The variable resistance element "R" may be in a low-resistance state, and the resistance of the variable resistance element "R" may be relatively small. The variable resistance element "R" may be in a parallel (P) state, and the memory cell 110 may store the first logical value (e.g., "0").

An example is described with reference to FIGS. 2 and 3 as a first end of the selection transistor ST is connected to the source line SL, a second end of the selection transistor ST is connected to a first end of the variable resistance element "R," and a second end of the variable resistance element "R" is connected to the bit line BL. The above connection is only an example, and the present inventive concepts are not limited thereto. For example, a first end of the selection transistor ST may be connected to the bit line BL, a second end of the selection transistor ST may be connected to a first end of the variable resistance element "R," and a second end of the variable resistance element "R" may be connected to the source line SL. Voltages that are applied to the bit line BL and the source line SL for the purpose of setting the variable resistance element "R" to a high-resistance value or a low-resistance state are not limited to the above example.

Figure 4:
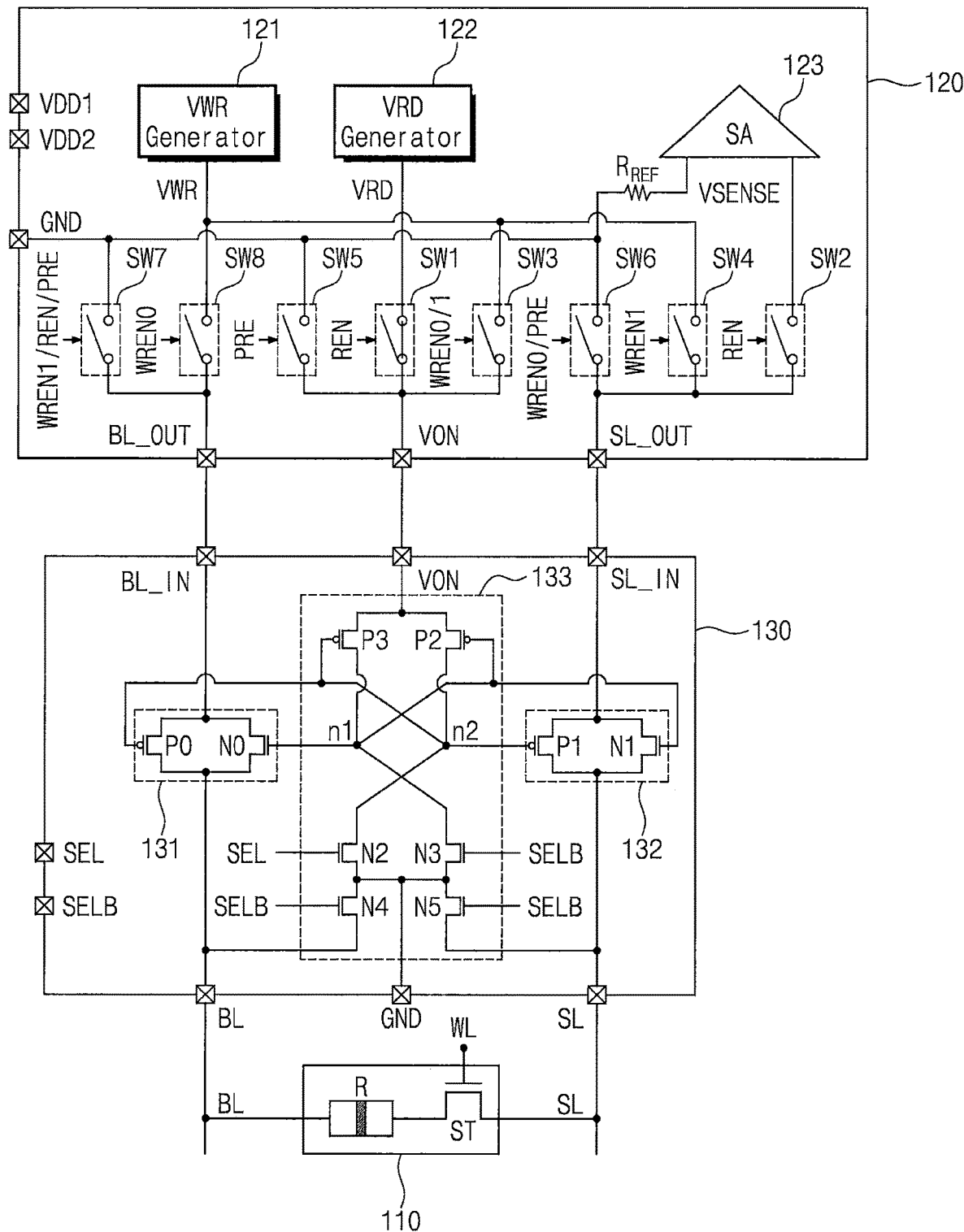
FIG. 4 illustrates a block diagram of the memory device of FIG. 1 in detail.

FIG. 4 illustrates a block diagram of the memory device 100 of FIG. 1 in detail. The memory cell 11Q may include the selection transistor ST and the variable resistance element "R" as described with reference to FIGS. 2 and 3.

The read and write circuit 120 may include a write voltage generator 121, a read voltage generator 122, and a sense amplifier 123. The read and write circuit 120 may also include a power supply voltage terminal VDD1 supplied with a power supply voltage VDD1, a power supply voltage terminal VDD2 supplied with a power supply voltage VDD2, a ground voltage terminal GND supplied with a ground voltage GND, a bit line output terminal BL_OUT connected to a bit line input terminal BL_IN of the switch circuit 130, an on voltage terminal VON connected to an on voltage terminal VON of the switch circuit 130, and a source line output terminal SL_OUT connected to a source line input terminal SL_IN of the switch circuit 130.

The write voltage generator 121 may generate and regulate the write voltage VWR by using at least one of the power supply voltages VDD1 and VDD2 supplied through the power supply voltage terminals VDD1 and VDD2. The read voltage generator 122 may generate and regulate the read voltage VRD by using at least one of the power supply voltages VDD1 and VDD2 supplied through the power supply voltage terminals VDD1 and VDD2. Each of the write voltage generator 121 and the read voltage generator 122 may include a charge pump circuit, a comparator, a reference voltage generator, etc. For example, the power supply voltage VDD1 may be applied to transistors where a thickness of a gate oxide is relatively thin, and the power supply voltage VDD2 may be applied to transistors where a thickness of a gate oxide is relatively thick. A level of the power supply voltage VDD1 may be lower than a level of the power supply voltage VDD2. The power supply voltage VDD1 may be the power supply voltage described with reference to FIG. 1, and may be used to generate the selection signal SEL and an inverted selection signal SELB.

For example, a level of the read voltage VRD may be higher than the level of the power supply voltage VDD1, and a level of the write voltage VWR may be higher than the level of the read voltage VRD. The level of the write voltage VWR may have to be high enough to change the first logical value stored in the memory cell 110 into the second logical value (and vice versa). Unlike the write voltage VWR, because the read voltage VRD is not used to change a logical value stored in the memory cell 110 but is used to read a logical value stored in the memory cell 110, the level of the read voltage VRD may be lower than the level of the write voltage VWR. The read voltage VRD that is lower in level than the write voltage VWR may improve the reliability or lifetime of transistors.

The sense amplifier 123 may generate a sense voltage VSENSE. The sense amplifier 123 may include a voltage source or a voltage generator configured to generate the sense voltage VSENSE. The sense amplifier 123 may sense data of the memory cell 110 by using the sense voltage VSENSE. In the read mode, the sense amplifier 123 may output the sense voltage VSENSE to a switch SW2 and a reference resistor $R_{REF}$. The sense amplifier 123 may compare a current flowing through the reference resistor $R_{REF}$ as the sense voltage VSENSE and the ground voltage GND are applied to opposite ends of the reference resistor $R_{REF}$, with a current flowing through the memory cell 110 as the sense voltage VSENSE and the ground voltage GND are applied to opposite ends of the memory cell 110. The sense amplifier 123 may sense data of the memory cell 110 based on a result of the comparison. For example, a level of the sense voltage VSENSE may be between the ground voltage GND and the power supply voltage VDD1.

The read and write circuit 120 may include switches SW1 to SW8. The switches SW1 to SW8 may be turned on or turned off by at least one of a read enable signal REN, write enable signals WREN0 and WREN1, and/or a precharge signal PRE. The read enable signal REN may be activated during the read mode for reading data stored in the memory cell 110 and may be deactivated during the remaining time. The write enable signal WREN0 may be activated during the write mode for writing data (e.g., the first logical value of "0") in the memory cell 110 and may be deactivated during the remaining time. The write enable signal WREN1 may be activated during the write mode for writing data (e.g., the second logical value of "1") in the memory cell 110 and may be deactivated during the remaining time. The precharge signal PRE may be activated during not the read mode and the write mode but a precharge mode for setting voltage levels of all nodes of switch circuits 131 and 132, bit line BL, and source line SL to a certain level (e.g., the ground voltage GND) before the read mode or the write mode, and may be deactivated during the remaining time. For example, the precharge mode and the precharge signal PRE may be referred to as an "equalization mode" and an "equalization signal," respectively.

When one of the precharge signal PRE, the read enable signal REN, and the write enable signal WREN1 is activated, the switch SW7 may be turned on and may output the ground voltage GND to the bit line output terminal BL_OUT. The switch SW7 may be turned off when the precharge signal PRE, the read enable signal REN, and the write enable signal WREN1 are deactivated. When the write enable signal WREN0 is activated, the switch SW8 may be turned on and may output the write voltage VWR to the bit line output terminal BL_OUT. The switch SW8 may be turned off when the write enable signal WREN0 is deactivated.

When the precharge signal PRE is activated, the switch SW5 may be turned on and may output the ground voltage GND to the on voltage terminal VON. The switch SW5 may be turned off when the precharge signal PRE is deactivated. When the read enable signal REN is activated, the switch SW1 may be turned on and may output the read voltage VRD to the on voltage terminal VON. The switch SW1 may be turned off when the read enable signal REN is deactivated. When one of the write enable signals WREN0 and WREN1 is activated, the switch SW3 may be turned on and may output the write voltage VWR to the on voltage terminal VON. The switch SW3 may be turned off when the write enable signals WREN0 and WREN1 are deactivated.

When one of the precharge signal PRE and the write enable signal WREN0 is activated, the switch SW6 may be turned on and may output the ground voltage GND to the source line output terminal SL_OUT. The switch SW6 may be turned off when the precharge signal PRE and the write enable signal WREN0 are deactivated. When the write enable signal WREN1 is activated, the switch SW4 may be turned on and may output the write voltage VWR to the source line output terminal SL_OUT. The switch SW4 may be turned off when the write enable signal WREN1 is deactivated. When the read enable signal REN is activated, the switch SW2 may be turned on and may output the sense voltage VSENSE to the source line output terminal SL_OUT. The switch SW2 may be turned off when the read enable signal REN is deactivated.

The switch circuit 130 may include the bit line input terminal BL_IN, the on voltage terminal VON, and the source line input terminal SL_IN respectively connected to the bit line output terminal BL_OUT, the on voltage terminal VON, and the source line output terminal SL_OUT of the read and write circuit 120. The switch circuit 130 may further include a bit line terminal BL connected to the bit line BL, a ground terminal GND supplied with the ground voltage GND, and a source line terminal SL connected to the source line SL. The switch circuit 130 may further include a selection terminal SEL receiving the selection signal SEL and an inverted selection terminal SELB receiving the inverted selection signal SELB. For example, because the inverted selection signal SELB may be an inverted version of the selection signal SEL, the inverted selection signal SELB may be deactivated when the selection signal SEL is activated and may be activated when the selection signal SEL is deactivated.

The switch 131 may be connected between the bit line input terminal BL_IN and the bit line terminal BL. The switch 131 may include transistors P0 and N0. A parallel connection of the transistors P0 and N0 may configure a transmission gate. A gate terminal of the transistor P0 may be connected to a node n2. A gate terminal of the transistor N0 may be connected to a node n1. Depending on voltage levels of the nodes n1 and n2, the transistors P0 and N0 may electrically connect the bit line input terminal BL_IN to the bit line terminal BL or may electrically disconnect the bit line input terminal BL_IN from the bit line terminal BL.

The switch 132 may be connected between the source line input terminal SL_IN and the source line terminal SL. The switch 132 may include transistors P1 and N1. A parallel connection of the transistors P1 and N1 may configure a transmission gate. A gate terminal of the transistor P1 may be connected to the node n2. A gate terminal of the transistor N1 may be connected to the node n1. Depending on voltage levels of the nodes n1 and n2, the transistors P1 and N1 may electrically connect the source line input terminal SL_IN to the source line terminal SL or may electrically disconnect the source line input terminal SL_IN from the source line terminal SL.

The switch controller 133 may include transistors N2 to N5, P2, and P3. Depending on the selection signal SEL and the inverted selection signal SELB, the switch controller 133 may determine voltage levels of the nodes n1 and n2 or may drive the bit line BL and the source line SL with the ground voltage GND. The memory cell 110 may be selected when the selection signal SEL is activated or may not be selected when the inverted selection signal SELB is activated.

The transistor N4 may be connected between the bit line terminal BL and the ground terminal GND. The transistor N4 may electrically connect the bit line BL to the ground voltage GND depending on the inverted selection signal SELB. When the inverted selection signal SELB is activated, the transistor N4 may drive the bit line BL with the ground voltage GND. The transistor N5 may be connected between the source line terminal SL and the ground terminal GND. The transistor N5 may electrically connect the source line SL to the ground voltage GND depending on the inverted selection signal SELB. When the inverted selection signal SELB is activated, the transistor N5 may drive the source line SL with the ground voltage GND.

The transistor N2 may be connected between the node n2 and the ground terminal GND. The transistor N2 may electrically connect the node n2 to the ground voltage GND depending on the selection signal SEL. When the selection signal SEL is activated, the transistor N2 may drive the node n2 with the ground voltage GND. The transistor N3 may be connected between the node n1 and the ground terminal GND. The transistor N3 may electrically connect the node n1 to the ground voltage GND depending on the inverted selection signal SELB. When the inverted selection signal SELB is activated, the transistor N3 may drive the node n1 with the ground voltage GND.

The transistor P2 may be connected between the node n2 and the on voltage terminal VON. The transistor P2 may apply one of the read voltage VRD and the write voltage VWR to the node n2 depending on the inverted selection signal SELB. When the node n1 is driven with the ground voltage GND by the transistor N3, the transistor P2 may be turned on and may drive the node n2 with a voltage (e.g., one of the read voltage VRD and the write voltage VWR) supplied through the on voltage terminal VON. The transistor P3 may be connected between the node n1 and the on voltage terminal VON. The transistor P3 may apply one of the read voltage VRD and the write voltage VWR to the node n1 depending on the selection signal SEL. When the node n2 is driven with the ground voltage GND by the transistor N2, the transistor P3 may be turned on and may drive the node n1 with a voltage (e.g., one of the read voltage VRD and the write voltage VWR) supplied through the on voltage terminal VON.

The transistors P2 and P3 may configure a cross-coupled pair. A drain terminal of the transistor P2 may be connected to the node n2 that is connected to gate terminals of the transistors P0 and P1, a drain terminal of the transistor N2, and a gate terminal of the transistor P3. The drain terminal of the transistor P3 may be connected to the node n1 that is connected to gate terminals of the transistors N0 and N1, a drain terminal of the transistor N3, and a gate terminal of the transistor P2.

The switch controller 133 may turn on or turn off the switches 131 and 132 by using a voltage (one of the ground voltage GND, the read voltage VRD, and the write voltage VWR) supplied through the on voltage terminal VON and the ground voltage GND. The switch controller 133 may receive the selection signal SEL and the inverted selection signal SELB that are based on the power supply voltage VDD1, but may not turn on or turn off the switches 131 and 132 by using the power supply voltage VDD1. Accordingly, even though a level of the power supply voltage VDD1 becomes lower, the switch controller 133 may fully turn on or turn off the switches 131 and 132.

In an embodiment, each of the transistors P0 to P3 and N0 to N5 of the switch circuit 130 may have a relatively thin gate oxide. The power supply voltage VDD2 that is greater than the power supply voltage VDD1 may not be directly applied to the transistors P0 to P3 and N0 to N5. The power supply voltage VDD1, the write voltage VWR, the read voltage VRD, and the sense voltage VSENSE may be directly applied to the transistors P0 to P3 and N0 to N5.

Figure 5A:
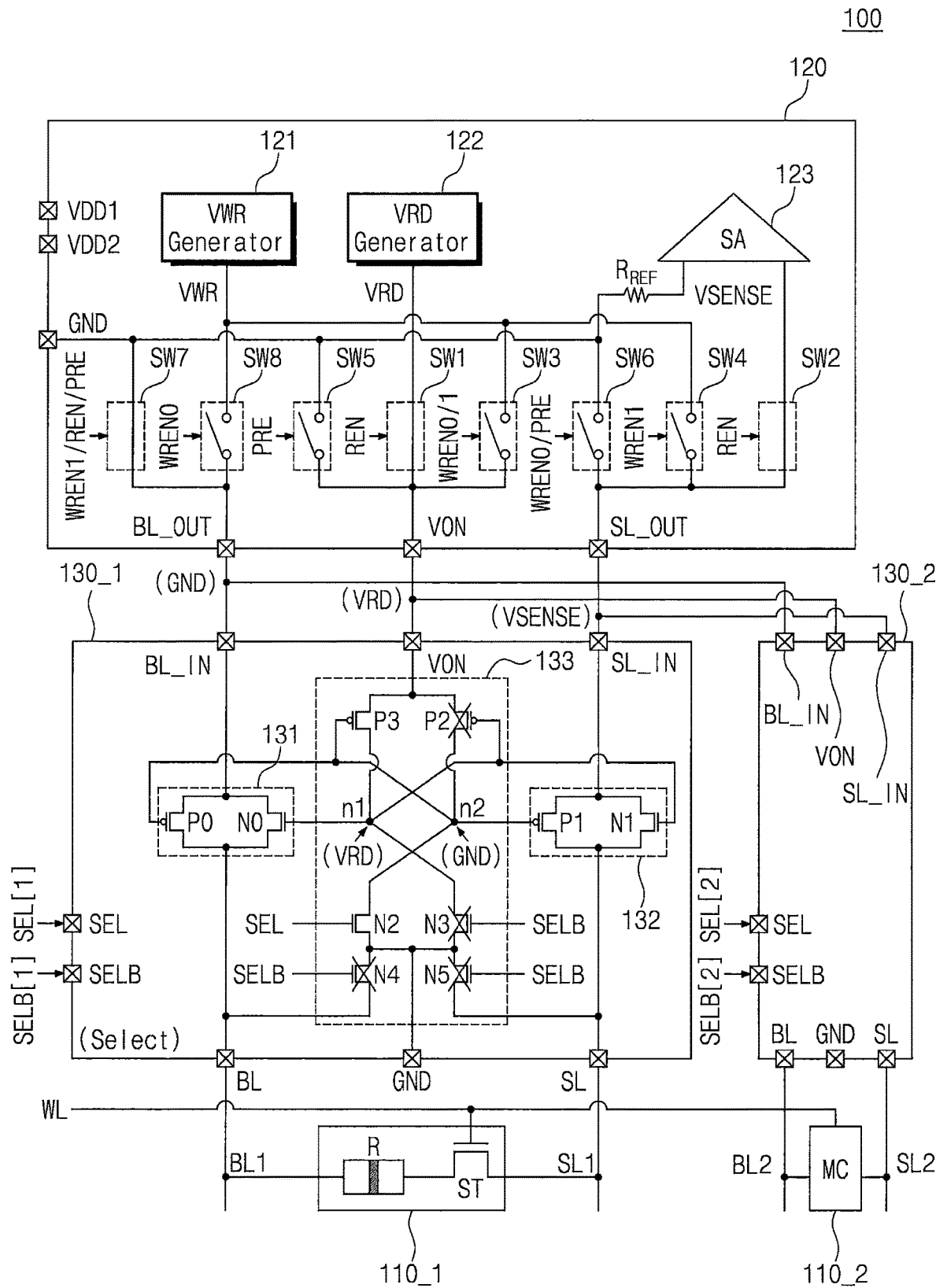
FIGS. 5A and 5B illustrate operations of the memory device of FIG. 4 in a read mode.
Figure 5B:
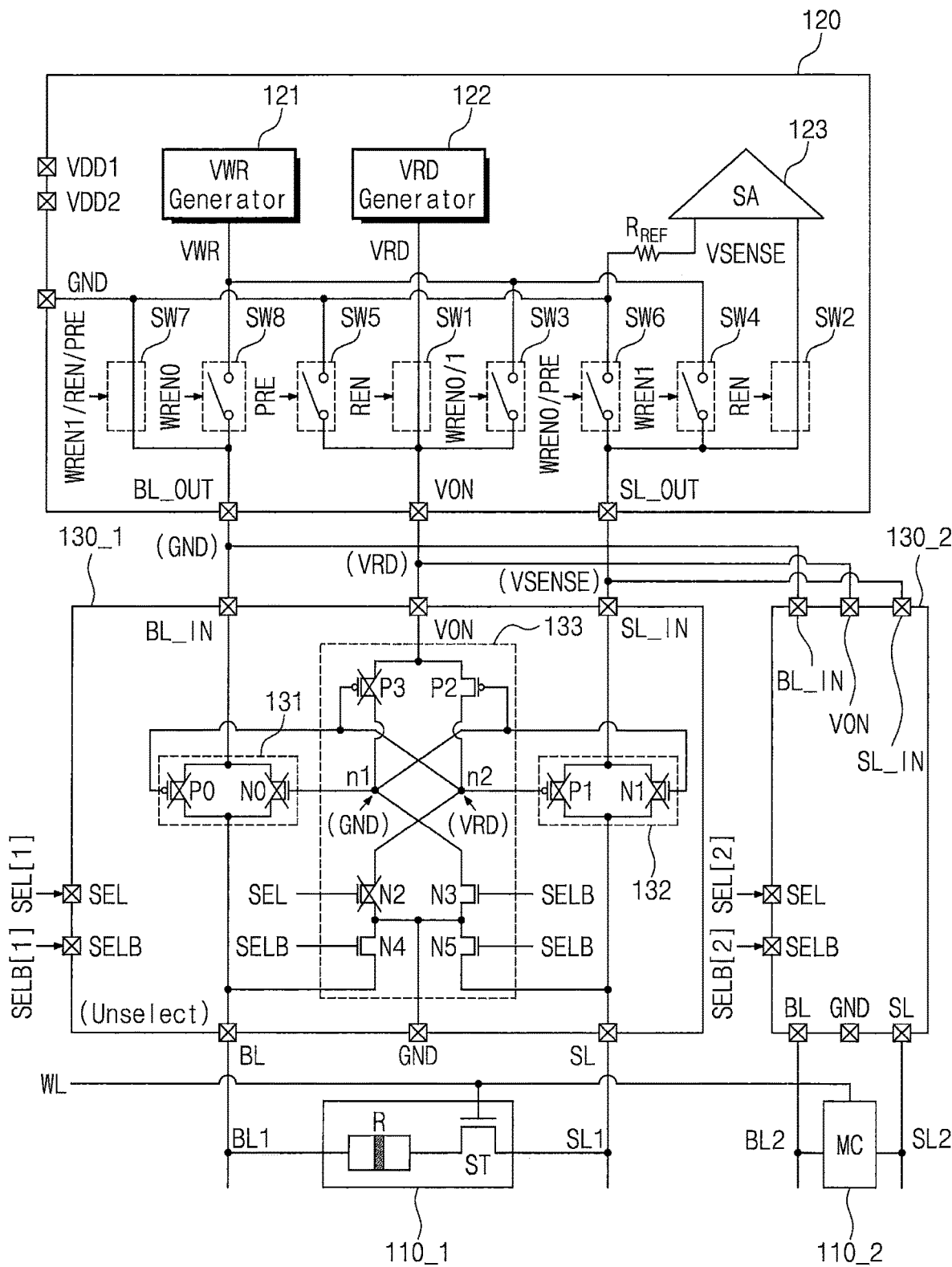

FIGS. 5A and 5B illustrate operations of a memory device of FIG. 4 in a read mode. An example is illustrated in FIGS. 1 to 4 as the memory cell 110 includes one memory cell 110 and one switch circuit 130, but the number of memory cells 110 and the number of switch circuits 130 may not be limited thereto. For example, the memory cell 110 may include two or more memory cells 110 and two or more switch circuits 130. In the example illustrated in FIGS. 5A and 5B, the memory device 100 includes memory cells 110_1 and 110_2 and switch circuits 130_1 and 130_2, but the inventive concepts are not limited thereto.

Each of the memory cells 110_1 and 110_2 may be substantially the same as the memory cell 110 described, with reference to FIGS. 1 to 4. The memory cells 110_1 and 110_2 may be connected in common to the word line WL, and the selection transistors ST of the memory cells 110_1 and 110_2 may be turned on when the word line WL is activated.

Each of the switch circuits 130_1 and 130_2 may be substantially the same as the switch circuit 130 described with reference to FIGS. 1 to 4. The switch circuit 130_1 may be connected to the memory cell 110_1 through the bit line BL1 and the source line SL1. The switch circuit 130_2 may be connected to the memory cell 110_2 through the bit line BL2 and the source line SL2. The switch circuit 130_1 may receive a selection signal SEL[1] and an inverted section signal SELB[1] through the selection terminal SEL and the inverted selection terminal SELB, respectively. The switch circuit 130_2 may receive a selection signal SEL[2] and an inverted section signal SELB[2] through the selection terminal SEL and the inverted selection terminal SELB, respectively.

The bit line input terminals BL_IN of the switch circuits 130_1 and 130_2 may be respectively connected to the bit line output terminal BL_OUT of the read and write circuit 120. The on voltage terminals VON of the switch circuits 130_1 and 130_2 may be respectively connected to the on voltage terminal VON of the read and write circuit 120. The source line input terminals SL_IN of the switch circuits 130_1 and 130_2 may be respectively connected to the source line input terminal SL_OUT of the read and write circuit 120. The read and write circuit 120 may access a memory cell through one selected from the switch circuits 130_1 and 130_2. The number of memory cells may be 2 or more, and the number of switch circuits may be 2 or more.

In FIG. 5A, it is assumed that the memory device 100 operates in the read mode for reading the memory cell 110_1. The precharge signal PRE and the write enable signals WREN0 and WREN1 may be deactivated, and the read enable signal REN may be activated. In the read and write circuit 120, the switches SW7, SW1, and SW2 may be turned on, and the remaining switches SW8, SW5, SW3, SW6, and SW4 may be turned off. The switch SW7 may provide the ground voltage GND to the switch 131 through the bit line output terminal BL_OUT and the bit line input terminal BL_IN of the switch circuit 130_1. The switch SW1 may provide the read voltage VRD to the switch controller 133 through the on voltage terminal VON and the on voltage terminal VON of the switch circuit 130_1. The switch SW2 may provide the sense voltage VSENSE to the switch 132 through the source line output terminal SL_OUT and the source line input terminal SL_IN of the switch circuit 130_1.

In the read mode, the word line WL may be activated, the selection signal SEL[1] may be activated, and the selection signal SEL[2] may be deactivated. The transistors P2, N3, N4, and N5 of the switch controller 133 may be turned off, and the transistors P3 and N2 of the switch controller 133 may be turned on. The node n1 may be driven with the read voltage VRD and the node n2 may be driven with the ground voltage GND by the transistors P3 and N2. As the ground voltage GND is applied to the gate terminals of the transistors P0 and P1 and the read voltage VRD is applied to the gate terminals of the transistors N0 and N1, the switches 131 and 132 may be turned on.

By using the read voltage VRD and the ground voltage GND, the switch circuit 130_1 may electrically connect the bit line input terminal BL_IN of the switch circuit 130_1 to the bit line terminal BL of the switch circuit 130_1 and may electrically connect the source line input terminal SL_IN of the switch circuit 130_1 to the source line terminal SL of the switch circuit 130_1. The switch controller 133 may turn on the switches 131 and 132 by using the ground voltage GND and the read voltage VRD supplied through the on voltage terminal VON. The switch 131 may output the ground voltage GND supplied through the bit line input terminal BL_IN of the switch circuit 130_1 to the bit line terminal BL of the switch circuit 130_1. The switch 132 may output the sense voltage VSENSE supplied through the source line input terminal SL_IN of the switch circuit 130_1 to the source line terminal SL of the switch circuit 130_1.

The read and write circuit 120 may apply the ground voltage GND to the bit line BL through the switch SW7, the bit line output terminal BL_OUT, the bit line input terminal BL_IN of the switch circuit 130_1, the switch 131, and the bit line terminal BL of the switch circuit 130_1. The read and write circuit 120 may apply the sense voltage VSENSE to the source line SL of the switch circuit 130_1 through the switch SW2, the source line output terminal SL_OUT, the source line input terminal SL_IN of the switch circuit 130_1, the switch 132, and the source line terminal SL of the switch circuit 130_1. The sense voltage VSENSE and the ground voltage GND may be applied to the opposite ends of the memory cell 110_1. As described above, the sense amplifier 123 may sense and amplify data of the memory cell 110_1 by comparing a current flowing through the memory cell 110_1 with a current flowing through the reference resistor $R_{REF}$.

In FIG. 5B, it is assumed that the memory device 100 operates in the read mode for reading the memory cell 110_2. Unlike FIG. 5A, the selection signal SEL[2] may be activated, and the selection signal SEL[1] may be deactivated. Operations of the read and write circuit 120, the switch circuit 130_2, and the memory cell 110_2 of FIG. 5B may be substantially the same as the operations of the read and write circuit 120, the switch circuit 130_1, and the memory cell 110_1 of FIG. 5A.

In the switch circuit 130_1, the transistors P2, N3, N4, and N5 of the switch controller 133 may be turned on, and the transistors P3 and N2 of the switch controller 133 may be turned off. The node n1 may be driven with the ground voltage GND and the node n2 may be driven with the read voltage VRD by the transistors P2, N3, N4, and N5. As the read voltage VRD is applied to the gate terminals of the transistors P0 and P1 and the ground voltage GND is applied to the gate terminals of the transistors N0 and N1, the switches 131 and 132 may be turned off.

Figure 6A:
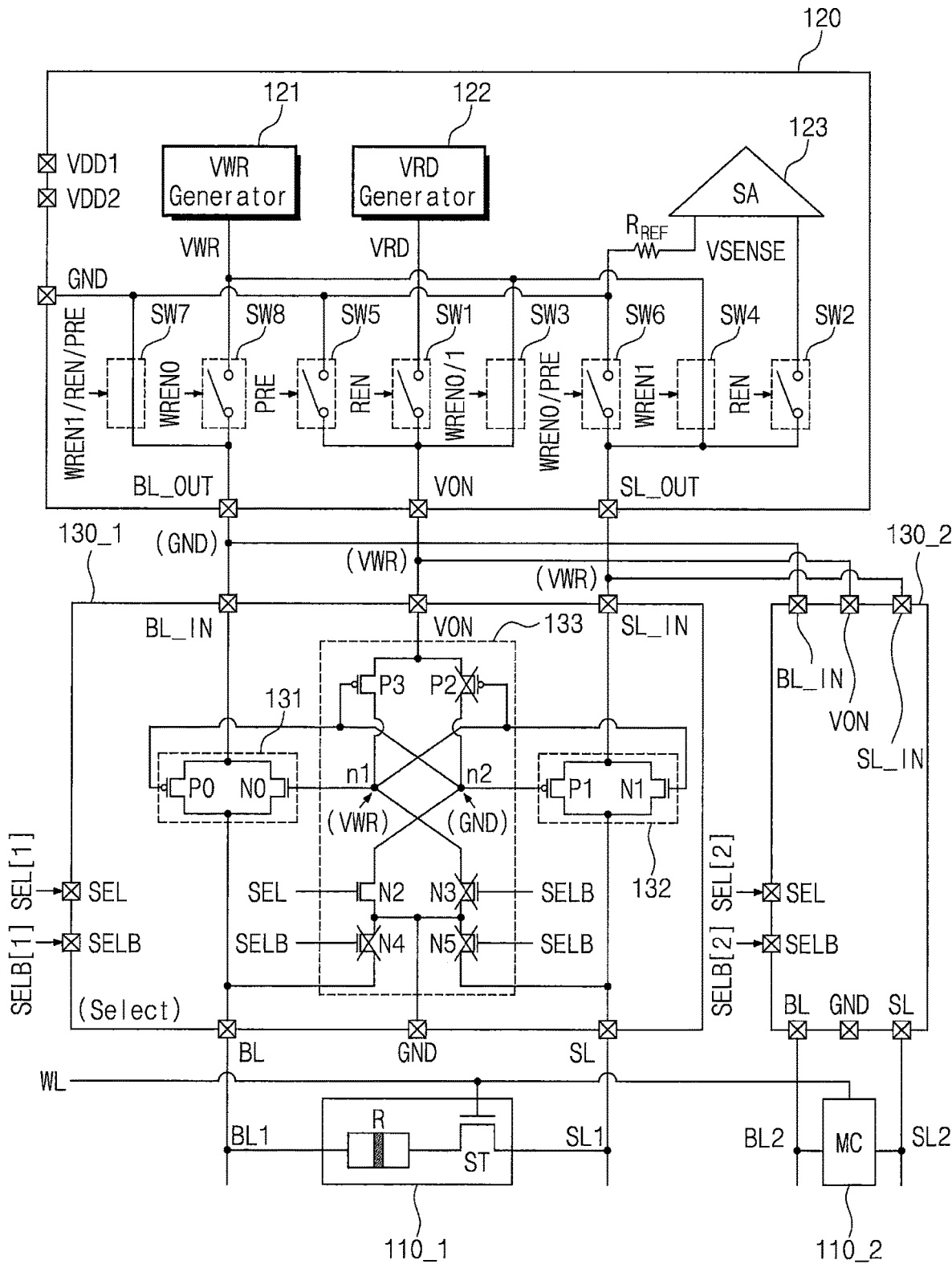
FIGS. 6A and 6B illustrate operations of the memory device of FIG. 4 in a write mode.
Figure 6B:
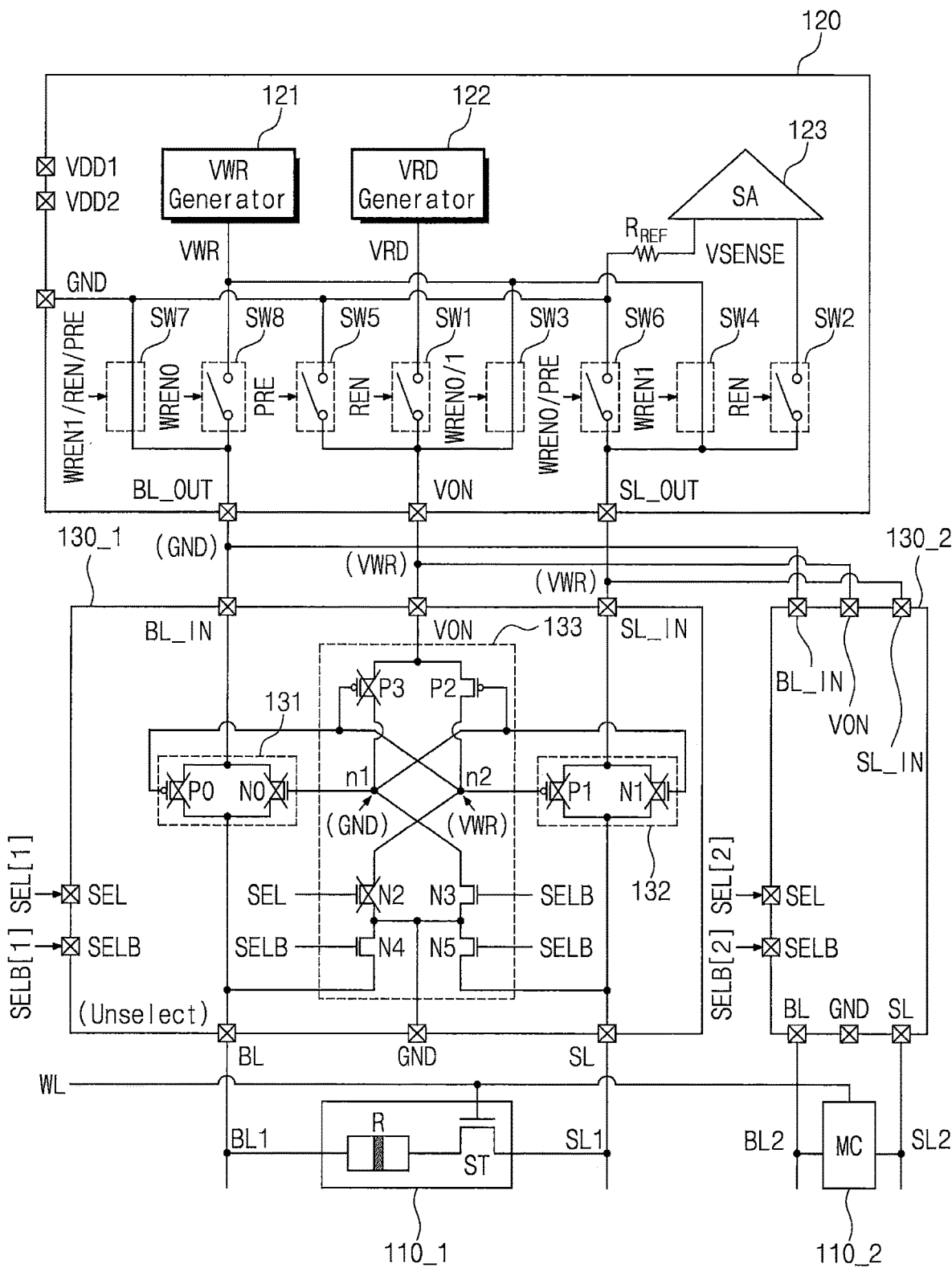

FIGS. 6A and 6B illustrate operations of the memory device of FIG. 4 in a write mode. As described with reference to FIGS. 5A and 5B, the memory device 100 may include the memory cells 110_1 and 110_2 and the switch circuits 130_1 and 130_2.

In FIG. 6A, it is assumed that the memory device 100 operates in the write mode for writing the second logical value in the memory cell 110_1 by setting the variable resistance element "R" of the memory cell 110_1 to the AP state. The precharge signal PRE, the write enable signal WREN0, and the read enable signal REN may be deactivated, and the write enable signal WREN1 may be activated. In the read and write circuit 120, the switches SW7, SW3, and SW4 may be turned on, and the remaining switches SW8, SW5, SW1, SW6, and SW2 may be turned off. The switch SW7 may provide the ground voltage GND to the switch 131 through the bit line output terminal BL_OUT and the bit line input terminal BL_IN of the switch circuit 130_1. The switch SW3 may provide the write voltage VWR to the switch controller 133 through the on voltage terminal VON and the on voltage terminal VON of the switch circuit 130_1. The switch SW4 may provide the write voltage VWR to the switch 132 through the source line output terminal SL_OUT and the source line input terminal SL_IN of the switch circuit 130_1.

In the write mode, the word line WL may be activated, the selection signal SEL[1] may be activated, and the selection signal SEL[2] may be deactivated. The transistors P2, N3, N4, and N5 of the switch controller 133 may be turned off, and the transistors P3 and N2 of the switch controller 133 may be turned on. The node n2 may be driven with the ground voltage GND and the node n1 may be driven with the write voltage VWR by the transistors P3 and N1 As the ground voltage GND is applied to the gate terminals of the transistors P0 and P1 and the write voltage VWR is applied to the gate terminals of the transistors N0 and N1, the switches 131 and 132 may be turned on.

By using the write voltage VWR and the ground voltage GND, the switch circuit 130_1 may electrically connect the bit line input terminal BL_IN of the switch circuit 130_1 to the bit line terminal BL of the switch circuit 130_1 and may electrically connect the source line input terminal SL_IN of the switch circuit 130_1 to the source line terminal SL of the switch circuit 130_1. The switch controller 133 may turn on the switches 131 and 132 by using the ground voltage GND and the write voltage VWR supplied through the on voltage terminal VON. The switch 131 may output the ground voltage GND supplied through the bit line input terminal BL_IN of the switch circuit 130_1 to the bit line terminal BL of the switch circuit 130_1. The switch 132 may output the write voltage VWR supplied through the source line input terminal SL_IN of the switch circuit 130_1 to the source line terminal SL of the switch circuit 130_1.

The read and write circuit 120 may apply the ground voltage GND to the bit line BL of the switch circuit 130_1 through the switch SW7, the bit line output terminal BL_OUT, the bit line input terminal BL_IN of the switch circuit 130_1, the switch 131, and the bit line terminal BL of the switch circuit 130_1. The read and write circuit 120 may apply the write voltage VWR to the source line SL of the switch circuit 130_1 through the switch SW4, the source line output terminal SL_OUT, the source line input terminal SL_IN of the switch circuit 130_1, the switch 132, and the source line terminal SL of the switch circuit 130_1. The read and write circuit 120 may write the second logical value in the memory cell 110_1.

In FIG. 6B, it is assumed that the memory device 100 operates in the write mode for writing the second logical value in the memory cell 110_2 by setting the variable resistance element "R" of the memory cell 110_2 to the AP state. Unlike FIG. 6A, the selection signal SEL[2] may be activated, and the selection signal SEL[1] may be deactivated. Operations of the read and write circuit 120, the switch circuit 130_2, and the memory cell 110_2 of FIG. 6B may be substantially the same as the operations of the read and write circuit 120, the switch circuit 130_1, and the memory cell 110_1 of FIG. 6A.

In the switch circuit 130_1, the transistors P2, N3, N4, and N5 of the switch controller 133 may be turned on, and the transistors P3 and N2 of the switch controller 133 may be turned off. The node n1 may be driven with the ground voltage GND and the node n2 may be driven with the write voltage VWR by the transistor P2, N3, N4, and N5. As the write voltage VWR is applied to the gate terminals of the transistors P0 and P1 and the ground voltage GND is applied to the gate terminals of the transistors N0 and N1, the switches 131 and 132 may be turned off.

Figure 7A:
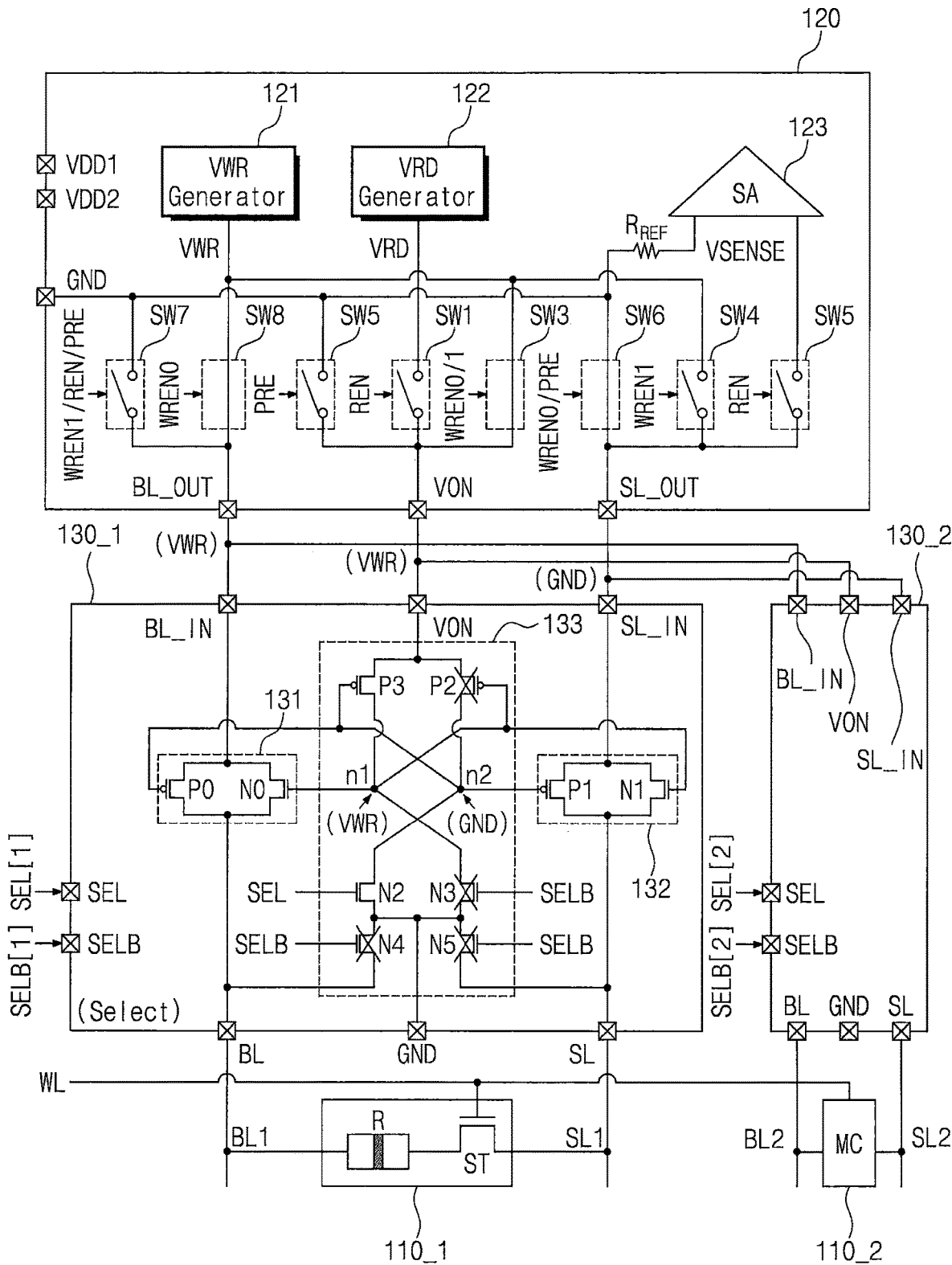
FIGS. 7A and 7B illustrate operations of the memory device of FIG. 4 in a write mode.
Figure 7B:
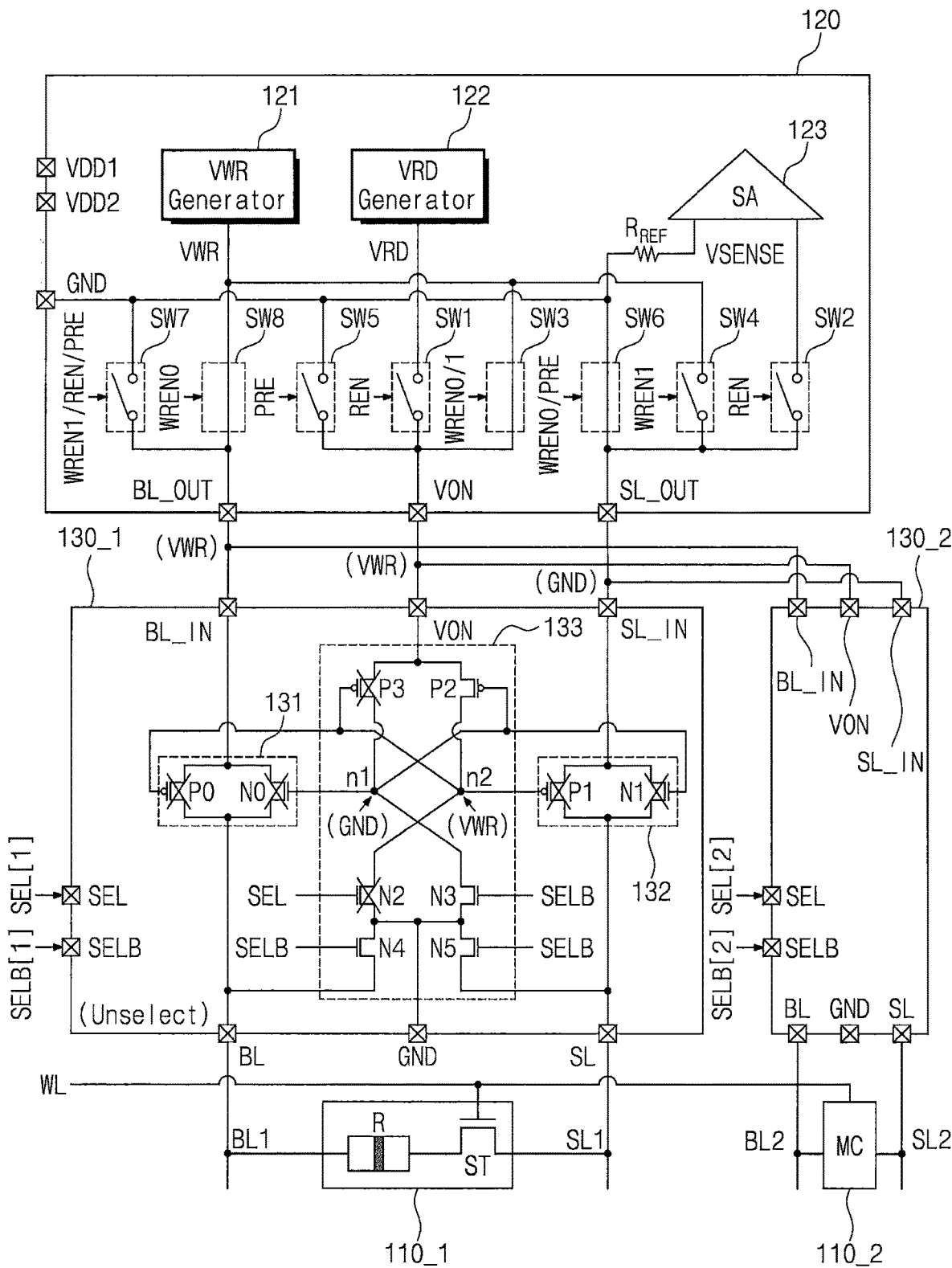

FIGS. 7A and 7B illustrate operations of the memory device of FIG. 4 in a write mode. A description will be focused on a difference between FIGS. 7A and 7B and FIGS. 6A and 6B. In FIG. 7A, it is assumed that the memory device 100 operates in the write mode for writing the first logical value in the memory cell 110_1 by setting the variable resistance element "R" of the memory cell 110_1 to the P state. The precharge signal PRE, the write enable signal WREN1, and the read enable signal REN may be deactivated, and the write enable signal WREN0 may be activated. In the read and write circuit 120, the switches SW8, SW3, and SW6 may be turned on, and the remaining switches SW7, SW5, SW1, SW4, and SW2 may be turned off. The switch SW8 may provide the write voltage VWR to the switch 131 through the bit line output terminal BL_OUT and the bit line input terminal BL_IN of the switch circuit 130_1. The switch SW3 may provide the write voltage VWR to the switch controller 133 through the on voltage terminal VON and the on voltage terminal VON of the switch circuit 130_1. The switch SW6 may provide the ground voltage GND to the switch 132 through the source line output terminal SL_OUT and the source line input terminal SL_IN of the switch circuit 130_1.

The switch 131 may output the write voltage VWR supplied through the bit line input terminal BL_IN to the bit line terminal BL of the switch circuit 130_1. The switch 132 may output the ground voltage GND supplied through the source line input terminal SL_IN to the source line terminal SL of the switch circuit 130_1. The read and write circuit 120 may apply the write voltage VWR to the bit line BL of the switch circuit 130_1 through the switch SW8, the bit line output terminal BL_OUT, the bit line input terminal BL_IN of the switch circuit 130_1, the switch 131, and the bit line terminal BL of the switch circuit 130_1. The read and write circuit 120 may apply the ground voltage GND to the source line SL of the switch circuit 130_1 through the switch SW6, the source line output terminal SL_OUT, the source line input terminal SL_IN of the switch circuit 130_1, the switch 132, and the source line terminal SL of the switch circuit 130_1. The read and write circuit 120 may write the first logical value in the memory cell 110_1.

In FIG. 7B, it is assumed that the memory device 100 operates in the write mode for writing the first logical value in the memory cell 110_2 by setting the variable resistance element "R" of the memory cell 110_2 to the P state. Unlike FIG. 7A, the selection signal SEL[2] may be activated, and the selection signal SEL[1] may be deactivated. Operations of the read and write circuit 120, the switch circuit 130_2, and the memory cell 110_2 of FIG. 7B may be substantially the same as the operations of the read and write circuit 120, the switch circuit 130_1, and the memory cell 110_1 of FIG. 7A. An operation of the switch circuit 130_1 of FIG. 7B is substantially the same as the operation of the switch circuit 130_1 of FIG. 6B.

Figure 8:
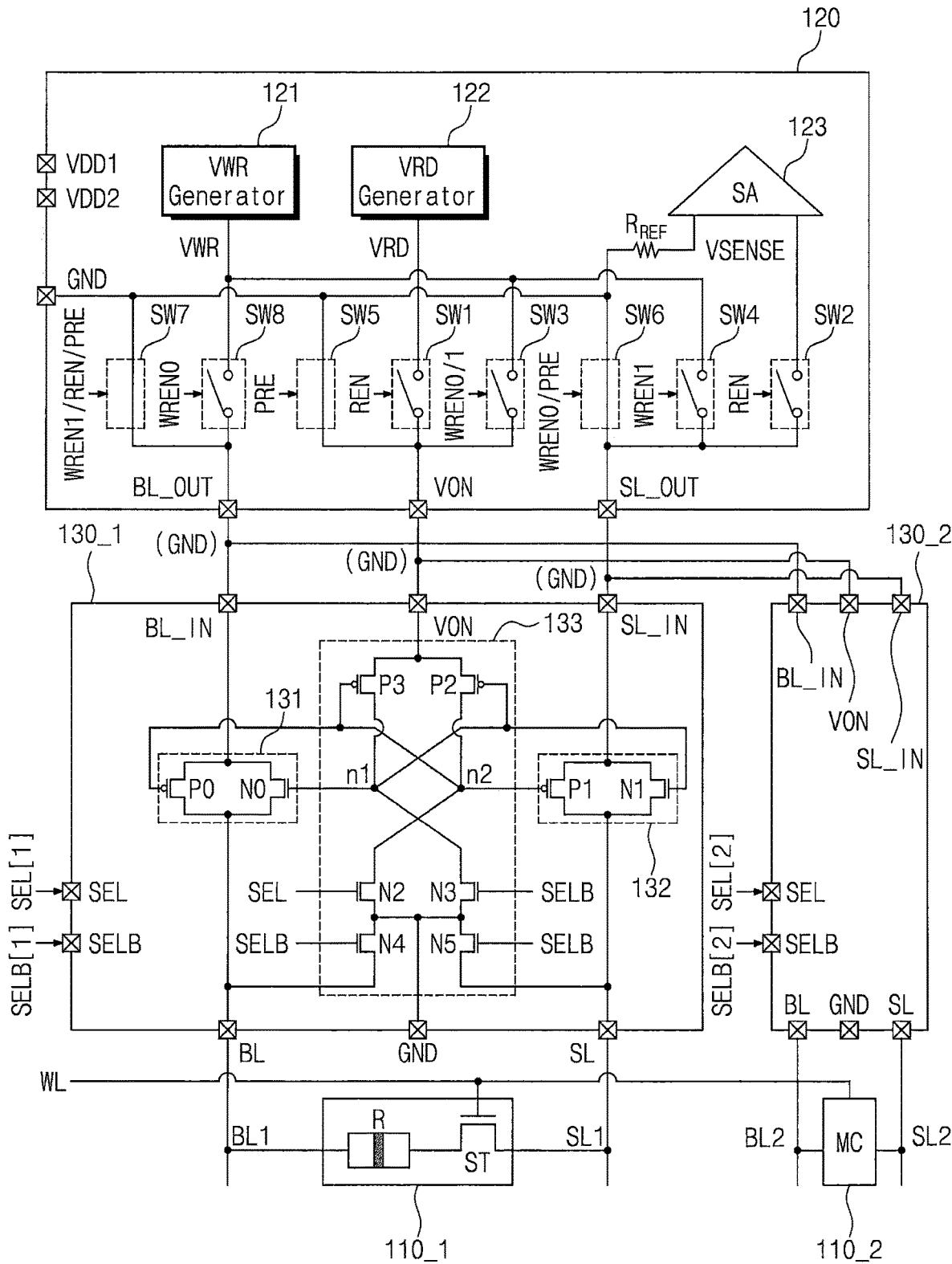
FIG. 8 illustrates operations of the memory device of FIG. 4 in a precharge mode.

FIG. 8 illustrates operations of the memory device of FIG. 4 in a precharge mode. As described with reference to FIGS. 5A and 5B, the memory device 100 may include the memory cells 110_1 and 110_2 and the switch circuits 130_1 and 130_2.

The write enable signals WREN0 and WREN1 and the read enable signal REN may be deactivated, and the precharge signal PRE may be activated. In the read and write circuit 120, the switches SW7, SW5, and SW6 may be turned on, and the remaining switches SW8, SW1, SW3, SW4, and SW2 may be turned off. The switch SW7 may provide the ground voltage GND to the switch 131 through the bit line output terminal BL_OUT and the bit line input terminal BL_IN of the switch circuit 130_1. The switch SW5 may provide the ground voltage GND to the switch controller 133 through the on voltage terminal VON and the on voltage terminal VON of the switch circuit 130_1. The switch SW6 may provide the ground voltage GND to the switch 132 through the source line output terminal SL_OUT and the source line input terminal SL_IN of the switch circuit 130_1. In the precharge mode, all nodes of the switch circuit 130_1 may be driven with the ground voltage GND.

Figure 9:
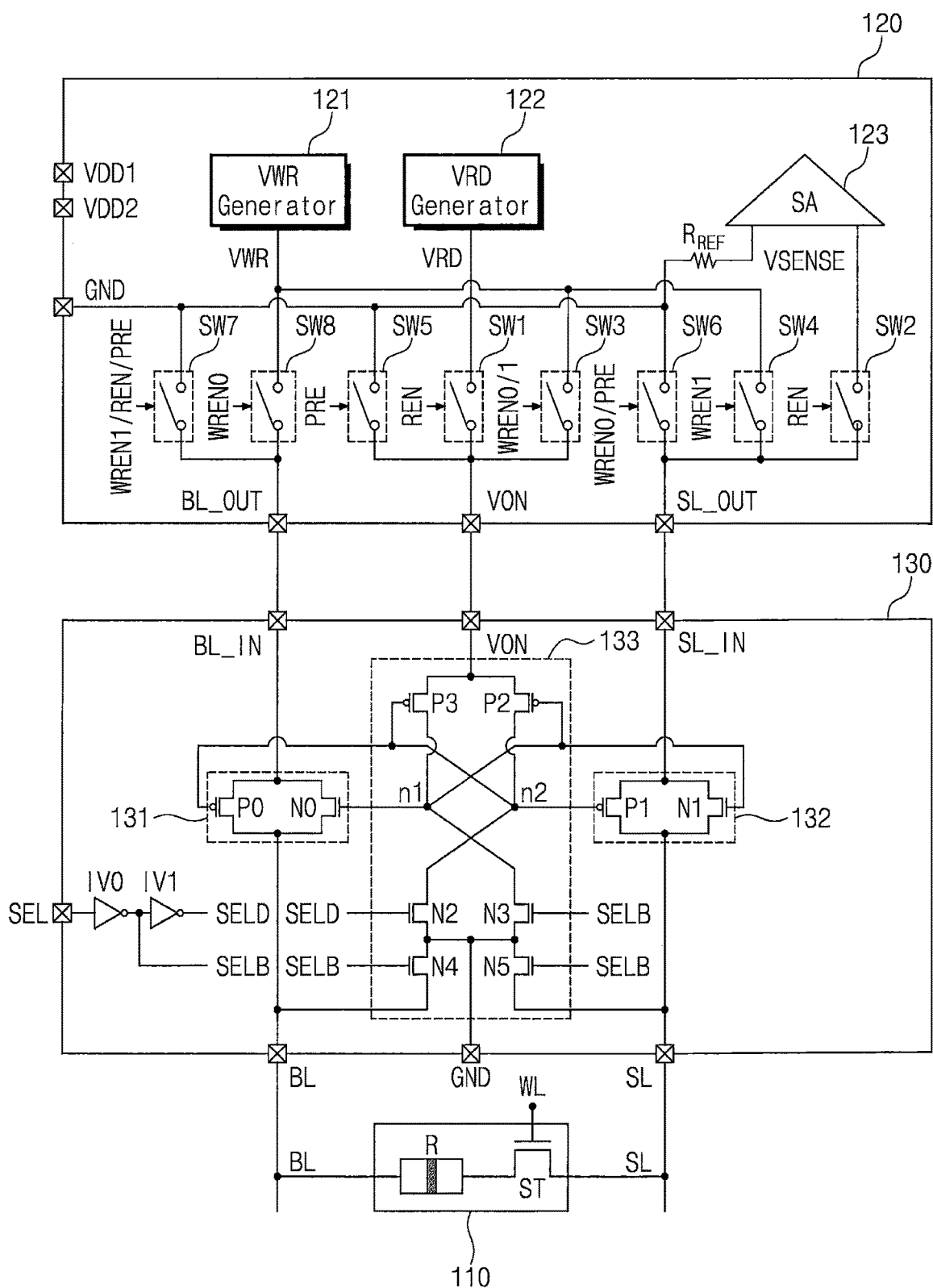
FIG. 9 illustrates a block diagram of the memory device of FIG. 1 according to another embodiment of the inventive concepts.

FIG. 9 illustrates a block diagram of the memory device of FIG. 1 according to another embodiment of the inventive concepts. A description will be focused on a difference between the memory device 100 of FIG. 9 and the memory device 100 of FIG. 4. The switch circuit 130 may not include the inverted selection terminal SELB and may include inverters IV0 and IV1. The inverter INV0 may receive the selection signal SEL and may generate the inverted selection signal SELB. The inverter INV1 may receive the inverted selection signal SELB and may generate a delay selection signal SELD. The transistor N2 may operate in response to the delay selection signal SELD, and the transistors N3 to N5 may operate in response to the inverted selection signal SELB.

Figure 10:
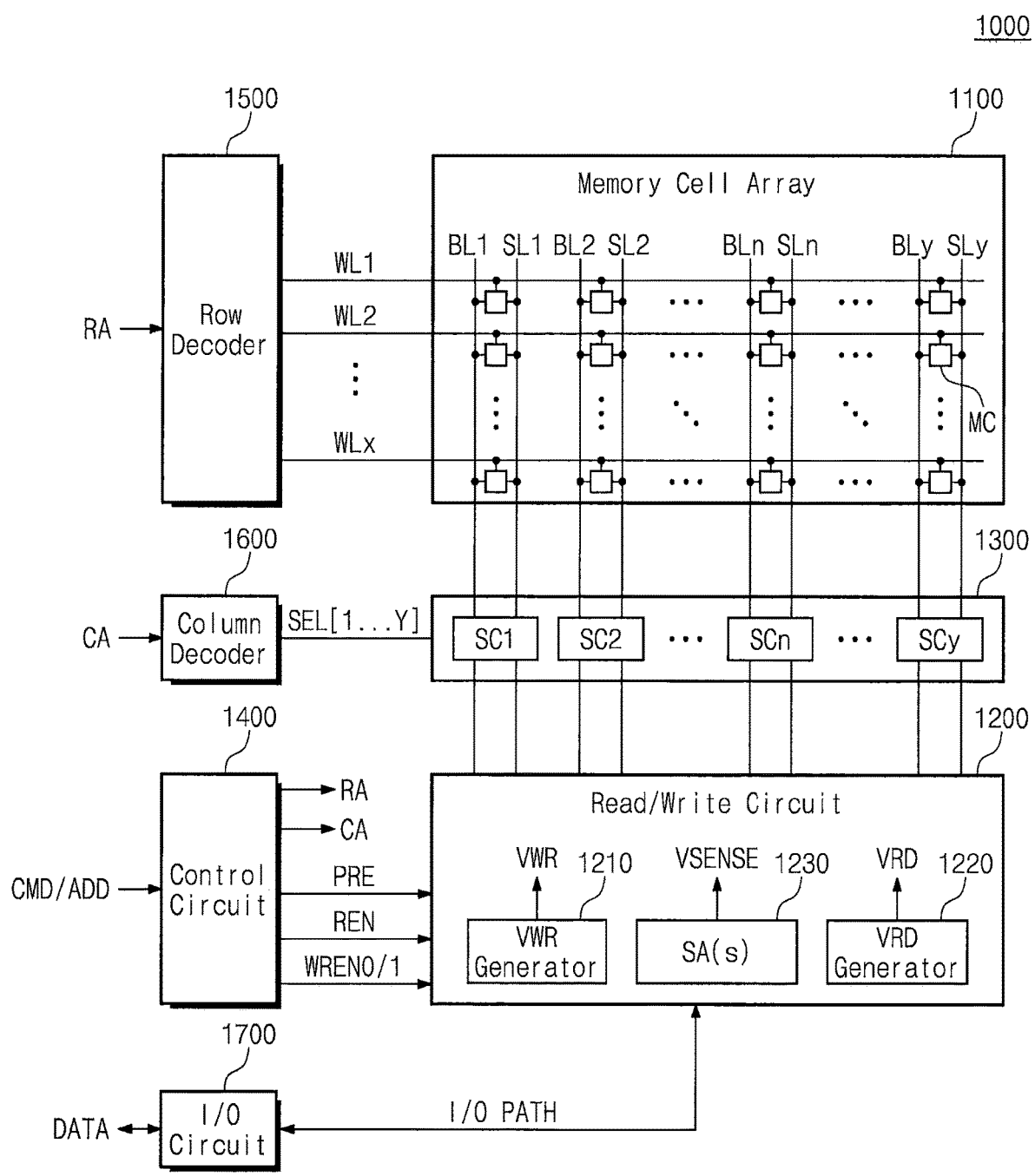
FIG. 10 illustrates a block diagram of a memory device according to an embodiment of the inventive concepts.

FIG. 10 illustrates a block diagram of a memory device according to an embodiment of the inventive concepts. A memory device 1000 may include a memory cell array 1100, a read and write circuit 1200, a switch array 1300, a control circuit 1400, a row decoder 1500, a column decoder 1600, and an input/output circuit 1700. The above components may operate based on the power supply voltage VDD1 described with reference to FIGS. 4 to 9. As described above, the read and write circuit 1200 may generate one of the read voltage VRD and the write voltage VWR by using at least one of the power supply voltage VDD1 and the power supply voltage VDD2.

The memory cell array 1100 may include memory cells MC arranged along a row direction and a column direction. Each of the memory cells MC may be substantially the same as the memory cell 110, 110_1, and 110_2 described with reference to FIGS. 1 to 9. The memory cells MC may be connected to word lines WL1 to WLx (x being a natural number of 1 or more), bit lines BL1 to BLy (y being a natural number of 1 or more), and source lines SL1 to SLy.

The read and write circuit 1200 may include a write voltage generator 1210 to generate the write voltage VWR, a read voltage generator 1220 to generate the read voltage VRD, and one or more sense amplifier(s) 1230 to generate the sense voltage VSENSE. The read and write circuit 1200 may be substantially the same as the read and write circuit 120 described with reference to FIGS. 1 to 9 and may include the switches SW1 to SW8 of the read and write circuit 120. One sense amplifier 1230 may be used to sense data of the memory cells MC connected to bit lines BL1 to BLy and source lines SL1 to SLy. Another sense amplifier 1230 may be further used to sense data of other memory cells MC of the memory cell array 1100. For example, the number of sense amplifiers 1230 may be one or more. The write voltage VWR generated by the write voltage generator 1210 may be used in common for all the memory cells MC of the memory cell array 1100 and all switch circuits SC1 to SCy of the switch array 1300. The read voltage VRD generated by the read voltage generator 1220 may be used in common for all the memory cells MC of the memory cell array 1100 and all the switch circuits SC1 to SCy of the switch array 1300.

The switch array 1300 may include the switch circuits SC1 to SCy. Each of the switch circuits SC1 to SCy may be substantially the same as the switch circuits 130, 130_1, and 130_2 described with reference to FIGS. 1 to 9. The switch circuit SC1 may provide a connection path between the read and write circuit 1200 and the memory cells MC connected to the bit line BL1 and the source line SL1 and arranged in the column direction, depending on the selection signal SEL[1]. The switch circuit SC2 may provide a connection path between the read and write circuit 1200 and the memory cells MC connected to the bit line BL2 and the source line SL2 and arranged in the column direction, depending on the selection signal SEL[2]. Likewise, the switch circuit SCy may provide a connection path between the read and write circuit 1200 and the memory cells MC connected to the bit line BLy and the source line SLy and arranged in the column direction, depending on the selection signal SEL[y].

The control circuit 1400 may receive a command CMD and an address ADD from the outside (e.g., a host or a memory controller) of the memory device 1000. The control circuit 1400 may control the remaining components 1100, 1200, 1300, 1500, 1600, and 1700 of the memory device 1000 based on the command CMD. The control circuit 1400 may generate a row address RA from the address ADD and may provide the row address RA to the row decoder 1500. The control circuit 1400 may generate a column address CA from the address ADD and may provide the column address CA to the column decoder 1600. The control circuit 1400 may generate the precharge signal PRE, the read enable signal REN, and the write enable signals WREN0 and WREN1 and may provide the precharge signal PRE, the read enable signal REN, and the write enable signals WREN0 and WREN1 to the read and write circuit 1200. The control circuit 1400 may activate the precharge signal PRE in the precharge mode, may activate the read enable signal REN in the read mode, and may activate one of the write enable signals WREN0 and WREN1 in the write mode.

Under control of the control circuit 1400, the row decoder 1500 may select or activate a word line corresponding to the row address RA from among the word lines WL1 to WLx. Under control of the control circuit 1400, the column decoder 1600 may select or activate a selection signal corresponding to the column address CA from among selection signals SEL1 to SELy. For example, when a read command or a write command for the memory cells MC corresponding to the address ADD is received from the outside, a word line connected to the memory cells MC corresponding to the address ADD may be activated, and a bit line and a source line connected to the memory cells MC corresponding to the address ADD may be connected to the read and write circuit 1200 through the switch array 1300.

The input/output circuit 1700 may receive read data from the read and write circuit 1200 through an input/output path and may output the read data to the outside. The input/output circuit 1700 may receive write data from the outside and may output the write data to the read and write circuit 1200 through the input/output path.

FIGS. 11 to 15 are block diagrams illustrating electronic devices to which a memory device according to an embodiment of the inventive concepts is applied. Each of electronic devices 2000 to 6000 may be referred to as a "computing system," a "memory system," an "electronic system," or a "communication system." For example, each of the electronic devices 2000 to 6000 may be, or be used in, a desktop computer, a laptop computer, a tablet computer, a mobile device, a smartphone, a personal digital assistant (PDA), a portable multimedia player (PMP), a wearable device, a video game console, a workstation, a server, a data processing device capable of using or supporting an interface protocol proposed by the mobile industry processor interface (MIPI) alliance, home appliances, a black box, a drone, etc.

Figure 11:
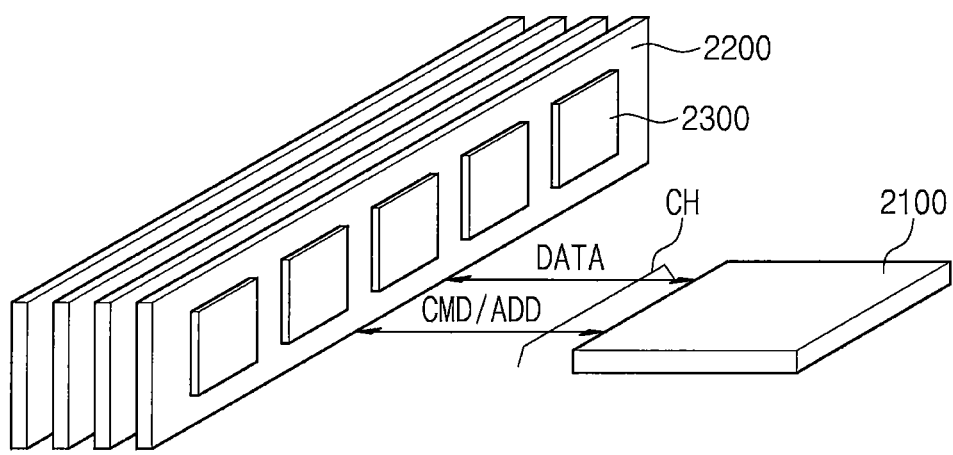
FIGS. 11 to 15 are block diagrams illustrating electronic devices to which a memory device according to an embodiment of the inventive concepts is applied.

Referring to FIG. 11, the electronic device 2000 may include a host 2100 and a memory module 2200. The host 2100 may exchange data with the memory module 2200. For example, the host 2100 may include one or more cores. The host 2100 may include a memory controller that controls the memory module 2200. The memory controller may transmit at least one of a command CMD, an address ADD, and data DATA to the memory module 2200 through a channel CH or may receive the data DATA from the memory module 2200 through the channel CH.

The memory module 2200 may include a memory device 2300. In the electronic device 2000, each of the number of memory modules 2200 and the number of memory devices 2300 attached to one memory module 2200 is one or more. The memory module 2200 may be a single in-line module (SIMM) or a dual in-line memory module (DIMM). The memory devices 2300 may include at least one of the memory devices 100 and 1000 described with reference to FIGS. 1 to 10, a static random access memory (SRAM) device, a dynamic RAM (DRAM) device, a thyristor RAM (TRAM) device, a NAND flash memory device, a NOR flash memory device, a resistive RAM (RRAM), a ferroelectric RAM (FRAM), and a phase change RAM (PRAM), and the number of kinds of the memory devices 2300 may be one or more. For example, the memory module 2200 may be a SIMM, a DIMM, a registered DIMM (RDIMM), a load reduced DIMM (LRDIMM), an unbuffered DIMM (UDIMM), a fully buffered DIMM (FB-DIMM), a small outline DIMM (SO-DIMM), a non-volatile DIMM (NVDIMM), etc.

Figure 12:
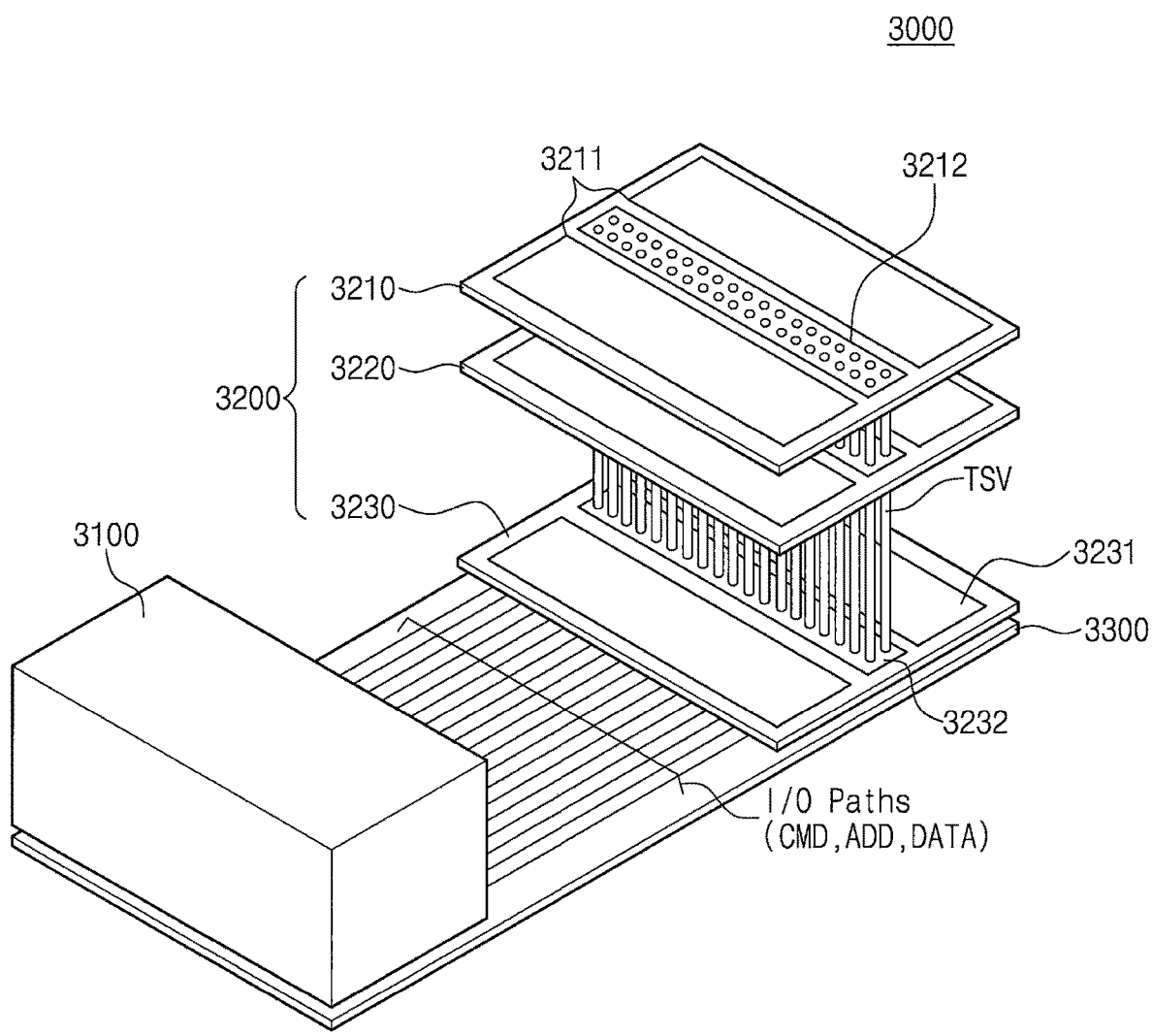

Referring to FIG. 12, an electronic device 3000 may include a system on chip (hereinafter referred to as a "SoC") 3100, a memory device 3200, and a substrate 3300. The SoC 3100 may include a processor, an on-chip memory, a memory controller, etc. The SoC 3100 that is an application processor may transmit at least one of a command CMD, an address ADD, and data DATA to the memory device 3200 through input/output paths on the substrate 3300 or may receive the data DATA from the memory device 3200 through the input/output paths.

The memory device 3200 may include memory dies 3210 and 3220 and a buffer die 3230, which may be stacked in a vertical direction. Through-silicon vias TSV may provide physical or electrical paths between the memory dies 3210 and 3220 and the buffer die 3230.

The memory die 3210 may include a first region 3211 and a second region 3212. The components of the memory device 100 or 1000 described with reference to FIGS. 1 to 10 may be placed in the first region 3211. The through-silicon vias TSV may be placed in the second region 3212, and/or circuits for transmitting or receiving signals through the through-silicon vias TSV may be placed in the second region 3212. The memory die 3220 may be implemented to be substantially the same as the memory die 3210. The buffer die 3230 (or referred to as a "core die" or a "logic die") may include a first region 3231 and a second region 3232. An interface circuit for receiving a command CMD, an address ADD, and data DATA transmitted from the SoC 3100 through the input/output paths or transmitting the data DATA to the SoC 3100 through the input/output paths may be placed in the first region 3231. Also, the components of the memory device 100 or 1000 described with reference to FIGS. 1 to 10 may be placed in the first region 3231. The through-silicon vias TSV may be placed in the second region 3232, and/or circuits for transmitting or receiving signals through the through-silicon vias TSV may be placed in the second region 3232.

The substrate 3300 may provide the input/output paths between the SoC 3100 and the memory device 3200. For example, the substrate 3300 may include a printed circuit board, a flexible circuit board, a ceramic substrate, or an interposer.

In an embodiment, the memory device 3200 may include a plurality of layers that are vertically stacked. The components 1200 to 1700 that constitute a peripheral circuit for controlling the memory cell array 1100 of FIG. 10 may be disposed at the lowermost layer of the stacked layers of the memory device 3200. A layer where the memory cell array 1100 is disposed may be placed on the layer where the components 1200 to 1700 are disposed. For example, the memory device 3200 may be formed in a cell on peripheral (COP) structure.

Figure 13:
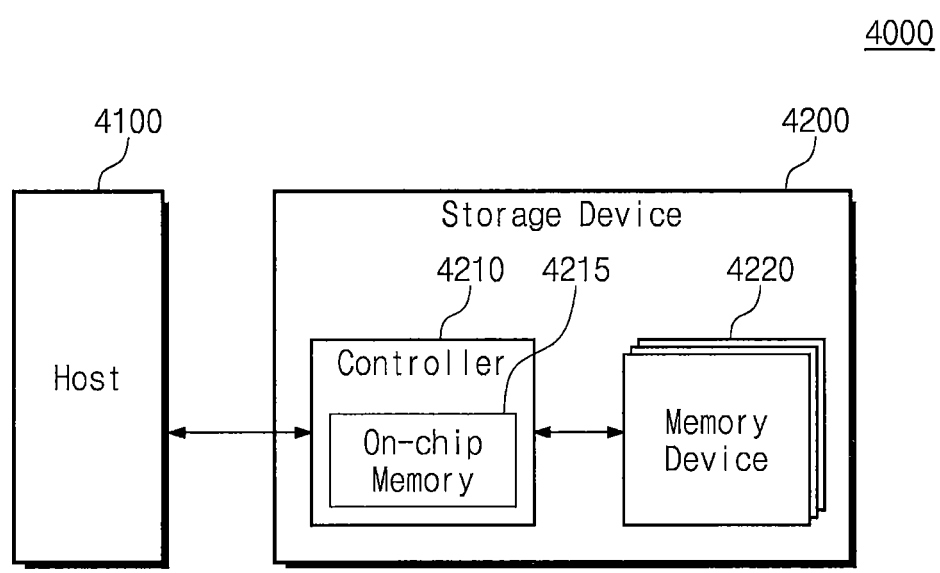

Referring to FIG. 13, an electronic device 4000 may include a host 4100 and a storage device 4200. The host 4100 may exchange data with the storage device 4200. For example, the host 4100 may include one or more cores.

The storage device 4200 may include a controller 4210 including an on-chip memory 4215 and memory devices 4220. The controller 4210 may process a request of the host 4100, may execute a program loaded onto the on-chip memory 4215, and may control the memory devices 4220. The on-chip memory 4215 and the memory devices 4220 may include at least one of the memory devices 100 and 1000 described with reference to FIGS. 1 to 10, such as an SRAM device, a DRAM device, a TRAM device, a NAND flash memory device, a NOR flash memory device, an RRAM device, a FRAM device, and/or a PRAM device. For example, the storage device 4200 may be a solid state drive (SSD) device, a memory card capable of being attached to or detached from the electronic device 4000, a secure digital (SD) card, an embedded multimedia card (eMMC), a universal flash storage (UFS) card, etc.

Figure 14:
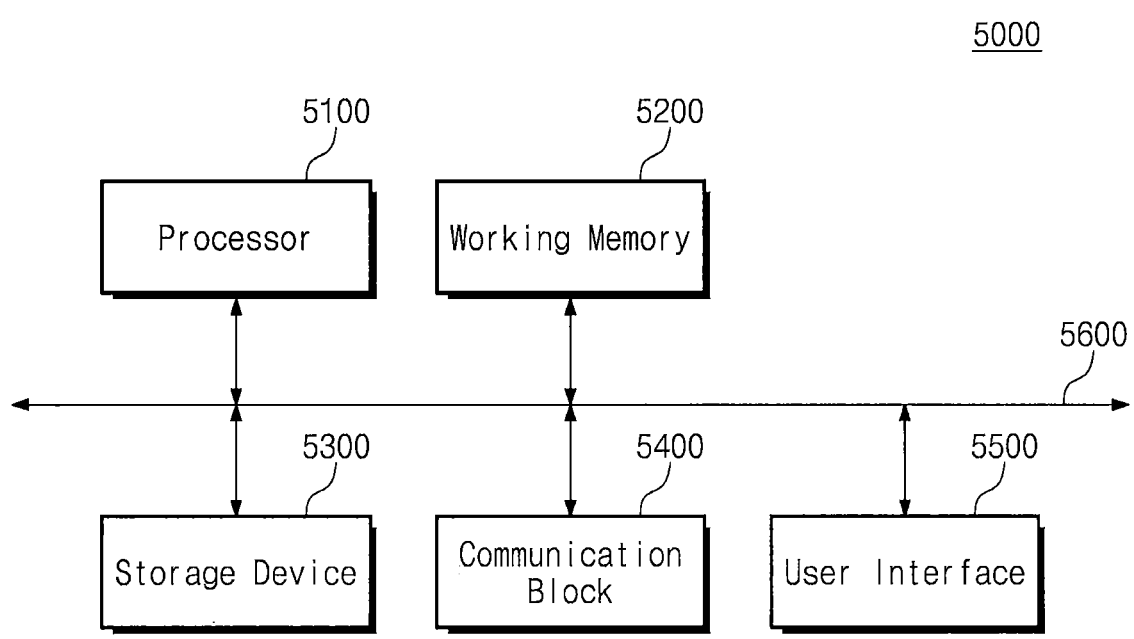

Referring to FIG. 14, an electronic device 5000 may include a processor 5100, a working memory 5200, a storage device 5300, a communication block 5400, a user interface 5500, and a bus 5600. The processor 5100 may control overall operations of the electronic device 5000. The processor 5100 may process various kinds of arithmetic operations and/or logical operations. The working memory 5200 and the storage device 5300 may exchange data with the processor 5100. The working memory 5200 may be used as a buffer or a cache of the electronic device 5000. The storage device 5300 may store data regardless of whether a power is supplied. The working memory 5200 and/or the storage device 5300 may include at least one of the memory devices 100 and 1000 described with reference to FIGS. 1 to 10, such as an SRAM device, a DRAM device, a TRAM device, a NAND flash memory device, a NOR flash memory device, an RRAM device, a FRAM device, and/or a PRAM device. For example, the storage device 5300 may be a solid state drive (SSD) device.

The communication block 5400 may communicate with the outside of the electronic device 5000 under control of the processor 5100. For example, the communication block 5400 may communicate with the outside of the electronic device 5000 based on at least one of various wireless communication protocols such as long term evolution (LTE), worldwide interoperability for microwave access (WiMax), global system for mobile communication (GSM), code division multiple access (CDMA), Bluetooth, near field communication (NFC), wireless fidelity (Wi-Fi), and radio frequency identification (RFID) and/or various wired communication protocols such as a transmission control protocol/Internet protocol (TCP/IP), universal serial bus (USB), small computer system interface (SCSI), advanced technology attachment (ATA), parallel ATA (PATA), serial ATA (SATA), serial attached SCSI (SAS), integrated drive electronics (IDE), and/or Firewire.

The user interface 5500 may provide a communication interface between a user and the electronic device 5000 under control of the processor 5100. For example, the user interface 5500 may include an input interface such as a keyboard, a mouse, a keypad, a button, a touch panel, a touchscreen, a touch pad, a touch ball, a camera, a microphone, a gyroscope sensor, and/or a vibration sensor. The user interface 5500 may include an output interface such as a liquid crystal display (LCD) device, a light emitting diode (LED) display device, an organic LED (OLED) display device, an active matrix OLED (AMOLED) display device, a speaker, and/or a motor.

The bus 5600 may provide a communication path between the components of the electronic device 5000. The components of the electronic device 5000 may exchange data with each other based on a bus format of the bus 5600. For example, the bus format may include one or more of various protocols such as USB, SCSI, peripheral component interconnect express (PCIe), mobile PCIe (M-PCIe), non-volatile memory express (NVMe), ATA, PATA, SATA, SAS, IDE, and universal flash storage (UFS).

Figure 15:
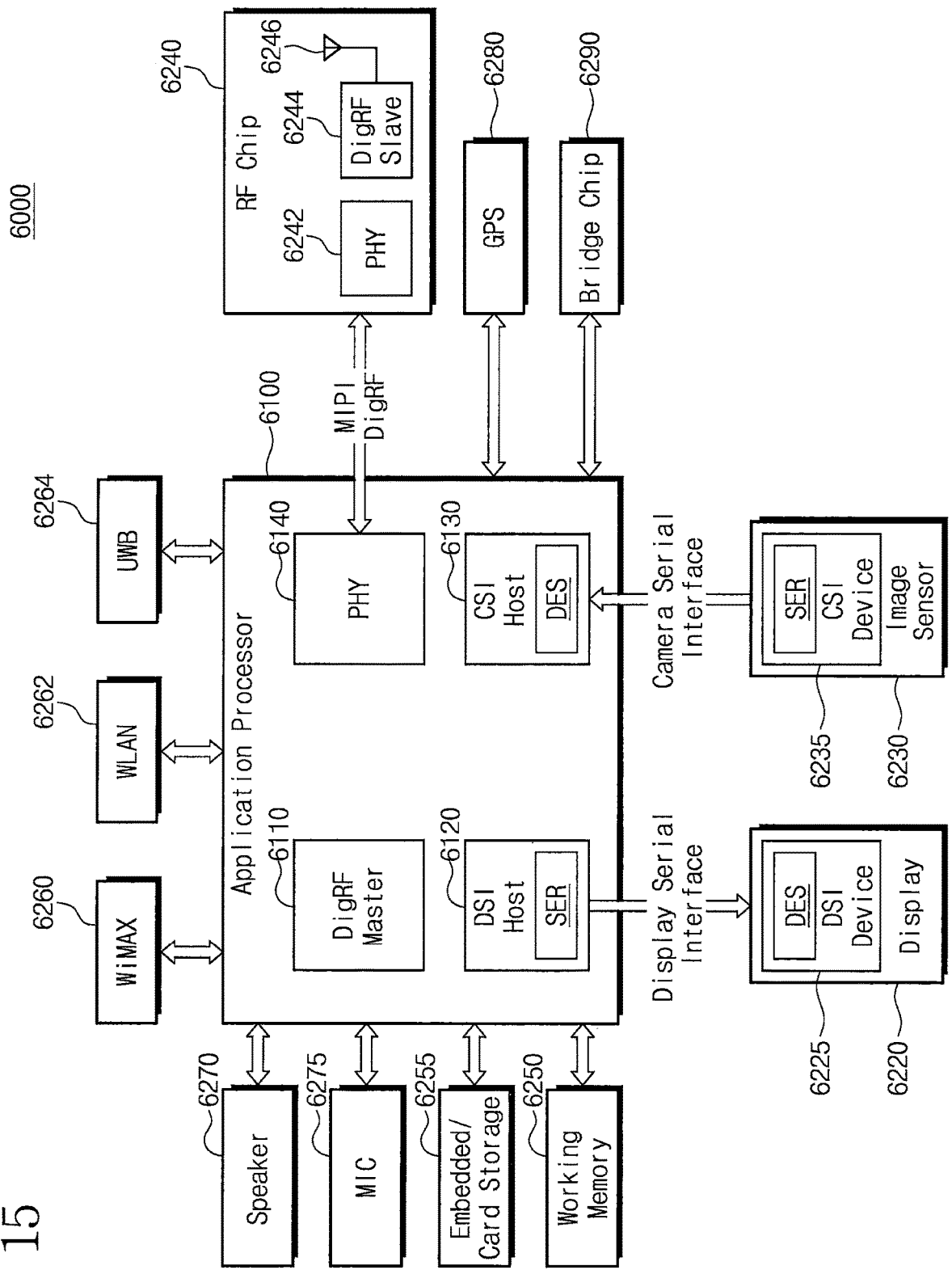

Referring to FIG. 15, the electronic device 6000 may include an application processor 6100, a display 6220, and an image sensor 6230. The application processor 6100 may include a DigRF master 6110, a display serial interface (DSI) host 6120, a camera serial interface (CSI) host 6130, and a physical layer 6140. The DSI host 6120 may communicate with a DSI device 6225 of the display 6220 in compliance with the DSI. For example, an optical serializer SER may be implemented in the DSI host 6120, and an optical deserializer DES may be implemented in the DSI device 6225. The CSI host 6130 may communicate with a CSI device 6235 of the image sensor 6230 through the CSI. For example, an optical deserializer DES may be implemented in the CSI host 6130, and an optical serializer SER may be implemented in the CSI device 6235. The electronic device 6000 may further include a radio frequency (RF) chip 6240 that communicates with the application processor 6100. The RF chip 6240 may include a physical layer 6242, a DigRF slave 6244, and an antenna 6246. For example, the physical layer 6242 of the RF chip 6240 and the physical layer 6140 of the application processor 6100 may exchange data with each other in compliance with the DigRF interface supported by the MIPI alliance.

The electronic device 6000 may further include a working memory 6250 and an embedded/card storage device 6255. The working memory 6250 and the embedded/card storage device 6255 may store or output data associated with the application processor 6100. The working memory 6250 and the embedded/card storage device 6255 may include at least one of the memory devices 100 and 1000 described with reference to FIGS. 1 to 10, such as an SRAM device, a DRAM device, a TRAM device, a NAND flash memory device, a NOR flash memory device, an RRAM device, a FRAM device, and/or a PRAM device. The embedded storage device 6255 may be embedded in the electronic device 6000, and the card storage device 6255 that is a removable device may be mounted on the electronic device 6000 or may be separated from the electronic device 6000.

The electronic device 6000 may communicate with an external device/system through a communication module, such as a WiMAX 6260, a wireless local area network (WLAN) 6262, or an ultra-wideband (UWB) 6264. In addition, the electronic device 6000 may communicate with the external device/system based on at least one of various wireless communication protocols, such as LTE, GSM, CDMA, Bluetooth, NFC, Wi-Fi, and RFID and/or various wired communication protocols, such as TCP/IP, USB, SCSI, M-PCIe, and Firewire. The electronic device 6000 may further include a speaker 6270 and a microphone 6275 for the purpose of processing voice information. The electronic device 6000 may further include a global positioning system (GPS) device 6280 for processing position information. The electronic device 6000 may further include a bridge chip 6290 for managing connection with peripheral devices.

A memory device according to an embodiment of the inventive concepts may operate a switch circuit for a bit line and a source line by using one of a read voltage and a write voltage independently of a power supply voltage. Accordingly, the memory device may prevent and/or reduce occurrences of a leakage current, a read fail, and/or a write fail caused as a power supply voltage becomes lower.

While the inventive concepts have been described with reference to example embodiments thereof, it will be apparent to those of ordinary skill in the art that various changes and modifications may be made thereto without departing from the spirit and scope of the inventive concepts as set forth in the following claims.

What is claimed is:

1. A memory device comprising:
a memory cell connected to a bit line and a source line;
a read and write circuit configured to read data of the memory cell and/or write data in the memory cell; and
a switch circuit configured to receive a selection signal based on a power supply voltage; wherein the switch circuit includes:
a first switch connected between the bit line and the read and write circuit;
a second switch connected between the source line and the read and write circuit; and
a switch controller configured to turn on or turn off the first and the second switches based on the selection signal using one of a read voltage and a write voltage that are different from the power supply voltage.

2. The memory device of claim 1, wherein levels of the read voltage and the write voltage are higher than a level of the power supply voltage.

3. The memory device of claim 1, wherein the first switch comprises a first transistor and a second transistor connected between the bit line and the read and write circuit,
wherein the second switch comprises a third transistor and a fourth transistor connected between the source line and the read and write circuit, and
wherein the switch controller is further configured to:
apply a ground voltage to gate terminals of the first transistor and the third transistor in a read mode or a write mode;
apply the read voltage to gate terminals of the second transistor and the fourth transistor in the read mode; and
apply the write voltage to the gate terminals of the second transistor and the fourth transistor in the write mode.

4. The memory device of claim 3, wherein the switch controller comprises:
a fifth transistor configured to electrically connect the gate terminals of the first transistor and the third transistor to the ground voltage based on the selection signal;
a sixth transistor configured to electrically connect the gate terminals of the second transistor and the fourth transistor to the ground voltage based on an inverted selection signal;
a seventh transistor configured to electrically connect the bit line to the ground voltage based on the inverted selection signal;
an eighth transistor configured to electrically connect the source line to the ground voltage based on the inverted selection signal;
a ninth transistor configured to apply one of the read voltage and the write voltage to the gate terminals of the second transistor and the fourth transistor based on the selection signal; and
a tenth transistor configured to apply one of the read voltage and the write voltage to the gate terminals of the first transistor and the third transistor based on the inverted selection signal.

5. The memory device of claim 4, wherein a gate terminal of the ninth transistor, a drain terminal of the tenth transistor, the gate terminal of the first transistor, the gate terminal of the third transistor, and a drain terminal of the fifth transistor are connected to each other, and
wherein a gate terminal of the tenth transistor, a drain terminal of the ninth transistor, the gate terminal of the second transistor, the gate terminal of the fourth transistor, and a drain terminal of the sixth transistor are connected to each other.

6. The memory device of claim 1, wherein the read and write circuit comprises:
a read voltage generator configured to generate the read voltage;
a write voltage generator configured to generate the write voltage; and
a sense amplifier configured to generate a sensing voltage and sense the data of the memory cell using the sensing voltage.

7. The memory device of claim 6, wherein the switch controller turns on the first and the second switches using the read voltage in a read mode,
wherein a ground voltage is applied to the bit line through the first switch in the read mode, and
wherein the sensing voltage is applied to the source line through the second switch in the read mode.

8. The memory device of claim 7, wherein the read and write circuit further comprises:
a third switch configured to provide the read voltage to the switch controller in the read mode;
a fourth switch configured to provide the ground voltage to the first switch in the read mode; and
a fifth switch configured to provide the sensing voltage to the second switch in the read mode.

9. The memory device of claim 7, wherein the sense amplifier is further configured to:
compare a first current flowing through the memory cell receiving the sensing voltage and the ground voltage with a second current flowing through a reference resistor receiving the sensing voltage and the ground voltage to generate a comparison result, and
sense the data of the memory cell based on the comparison result.

10. The memory device of claim 6, wherein the switch controller turns on the first and the second switches using the write voltage in a write mode,
wherein one of a ground voltage and the write voltage is applied to the bit line through the first switch in the write mode, and
wherein the other one of the ground and the write voltage is applied to the source line through the second switch in the write mode.

11. The memory device of claim 10, wherein the read and write circuit further comprises:
a third switch configured to provide the write voltage to the switch controller in the write mode;
a fourth switch configured to provide the ground voltage to the first switch in the write mode;
a fifth switch configured to provide the write voltage to the first switch in the write mode;
a sixth switch configured to provide the ground voltage to the second switch in the write mode; and
a seventh switch configured to provide the write voltage to the second switch in the write mode.

12. A memory device comprising:
a memory cell connected to a bit line and a source line; and a switch circuit, wherein the switch circuit comprises:
a first terminal connected to the bit line;
a second terminal connected to the source line;
a third terminal receiving one of a ground voltage and a write voltage;
a fourth terminal receiving one of the ground voltage, the write voltage, and a sensing voltage;
a fifth terminal receiving one of the ground voltage, the write voltage, and a read voltage; and
a sixth terminal receiving a selection signal based on a power supply voltage, and
wherein the switch circuit is configured to electrically connect the third terminal to the first terminal and electrically connect the fourth terminal to the second terminal based on the selection signal using one of the read voltage and the write voltage that are different from the power supply voltage.

13. The memory device of claim 12, further comprising:
a read voltage generator configured to generate the read voltage;
a write voltage generator configured to generate the write voltage; and
a sense amplifier configured to generate the sensing voltage and sense data of the memory cell using the sensing voltage.

14. The memory device of claim 13, wherein, in a read mode, the switch circuit is further configured to:
output the ground voltage that is received through the third terminal to the first terminal;
output the sensing voltage that is received through the fourth terminal to the second terminal; and
receive the read voltage through the fifth terminal.

15. The memory device of claim 13, wherein, in a write mode, the switch circuit is further configured to:
output one of the ground voltage and the write voltage that is received through the third terminal to the first terminal;
output the other one of the ground voltage and the write voltage that is received through the fourth terminal to the second terminal; and
receive the write voltage through the fifth terminal.

16. The memory device of claim 13, wherein, in a precharge mode that is different from a read mode or a write mode, the switch circuit is further configured to:

receive the ground voltage through the third terminal;
receive the ground voltage through the fourth terminal; and
receive the ground voltage through the fifth terminal.

17. A memory device comprising:
a memory cell array comprising a first memory cell and a second memory cell;
a read voltage generator configured to generate a read voltage;
a write voltage generator configured to generate a write voltage;
a sense amplifier configured to generate a sensing voltage;
a first switch circuit configured to electrically connect the sense amplifier to the first memory cell using the read voltage or electrically connect the write voltage generator to the first memory cell using the write voltage responsive to a first selection signal that is based on a power supply voltage; and
a second switch circuit configured to electrically connect the sense amplifier to the second memory cell using the read voltage or electrically connect the write voltage generator to the second memory cell using the write voltage responsive to a second selection signal that is based on the power supply voltage.

18. The memory device of claim 17, wherein the sensing voltage and a ground voltage are applied to the first memory cell through the first switch circuit responsive to the first selection signal being activated in a read mode, and
wherein the sensing voltage and the ground voltage are applied to the second memory cell through the second switch circuit responsive to the second selection signal being activated in the read mode.

19. The memory device of claim 17, wherein the write voltage and a ground voltage are applied to the first memory cell through the first switch circuit responsive to the first selection signal being activated in a write mode, and
wherein the write voltage and the ground voltage are applied to the second memory cell through the second switch circuit responsive to the second selection signal being activated in the write mode.

20. The memory device of claim 17, wherein levels of the read voltage and the write voltage are higher than a level of the power supply voltage.

* * * * *